United States Patent
Mu et al.

(10) Patent No.: US 8,768,283 B2
(45) Date of Patent: Jul. 1, 2014

(54) COMPLEX INTERMEDIATE FREQUENCY MIXER STAGE AND CALIBRATION THEREOF

(75) Inventors: Fenghao Mu, Hjärup (SE); Lars Sundström, Södra Sandby (SE); Leif Wilhelmsson, Dalby (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 13/823,785
(22) PCT Filed: Sep. 16, 2011
(86) PCT No.: PCT/EP2011/066099
§ 371 (c)(1), (2), (4) Date: Mar. 15, 2013
(87) PCT Pub. No.: WO2012/038336
PCT Pub. Date: Mar. 29, 2012

(65) Prior Publication Data
US 2013/0183921 A1 Jul. 18, 2013

Related U.S. Application Data

(60) Provisional application No. 61/389,949, filed on Oct. 5, 2010.

(30) Foreign Application Priority Data

Sep. 24, 2010 (EP) ..................................... 10010556

(51) Int. Cl.
*H04B 1/26* (2006.01)
*H04B 1/10* (2006.01)
(52) U.S. Cl.
USPC ............................ 455/326; 455/302; 455/334
(58) Field of Classification Search
CPC .............. H03D 7/18; H04B 1/28; H04B 1/30; H04B 1/06
USPC ................. 455/296, 302, 313, 323, 326, 334, 455/552.1, 553.1; 375/322, 324
See application file for complete search history.

(56) References Cited

U.S. PATENT DOCUMENTS 6,330,290 B1  12/2001  Glas
6,892,060 B2   5/2005  Zheng
(Continued)

FOREIGN PATENT DOCUMENTS

EP   0305603 A1   3/1989
EP   1111803 A1   6/2001
(Continued)

OTHER PUBLICATIONS

Der, L and Razavi, B., "A 2GHz CMOS Image-Reject Receiver with LMS Calibration", IEEE Journal of Solid-State Circuits, vol. 32, No. 2, Feb. 2003, pp. 167-175.

*Primary Examiner* — Quochien B Vuong
(74) *Attorney, Agent, or Firm* — Coats & Bennett, P.L.L.C.

(57) ABSTRACT

The invention relates to a complex intermediate frequency (CIF) mixer stage, methods of operation thereof, and methods of calibration thereof. The CIF mixer stage comprises numerous individual mixers driven by IF clock signals to downconvert received IF signals into a set of signals at baseband frequency which are further combined to form a lower side band signal and an upper side band signal. The IF clock signals used have a predefined phase relationship among them, which involves tuneable phase skews. By calibration of the conversion gains and the phases of the IF clock signals the gain and phase imbalance introduced in a preceding radio frequency mixer stage and/or the CIF mixer stage can be cancelled. Further, in-channel IQ leakage control can be applied to the lower side band signal and/or the upper side band signal. The CIF mixer stage can thus effectively suppress image interference and IQ leakage.

26 Claims, 12 Drawing Sheets

(56) References Cited

U.S. PATENT DOCUMENTS

| | | |
|---|---|---|
| 7,130,604 B1 | 10/2006 | Wong et al. |
| 7,248,625 B2 | 7/2007 | Chien |
| 7,301,686 B2 | 11/2007 | Tanaka et al. |
| 8,036,625 B1 * | 10/2011 | Clement ............... 455/323 |
| 8,160,529 B1 * | 4/2012 | Clement et al. ........ 455/302 |
| 2006/0133548 A1 | 6/2006 | Oh et al. |
| 2009/0291649 A1 | 11/2009 | Fortier et al. |
| 2010/0067622 A1 | 3/2010 | Komaili et al. |

FOREIGN PATENT DOCUMENTS

| | | |
|---|---|---|
| WO | 9914863 A1 | 3/1999 |
| WO | 0139364 A1 | 5/2001 |
| WO | 2005091493 A1 | 9/2005 |
| WO | 2009057051 A2 | 5/2009 |
| WO | 2012038338 A1 | 3/2012 |

* cited by examiner

100

110
- provide IF signals comprising a first phase signal and a second phase signal to a CIF mixer stage to be converted to baseband frequency signals comprising a lower side band signal and an upper side band signal, the CIF mixer stage comprising a first branch comprising first, second, and third mixers and a second branch comprising fourth, fifth, and sixth mixers; the first phase signal provided to the mixers of the first branch and the second phase signal provided to the mixers of the second branch;

- provide a first IF clock signal to the first mixer to convert the first phase signal received thereat to a first output signal;

- provide a second IF clock signal to the second mixer to convert the first phase signal received thereat to a second output signal;

- provide a third IF clock signal to the third mixer to convert the first phase signal received thereat to a third output signal;

- provide the second IF clock signal to the fourth mixer to convert the second phase signal received thereat to a fourth output signal;

- provide the third IF clock signal to the fifth mixer to convert the second phase signal received thereat to a fifth output signal;

- providing the first IF clock signal to the sixth mixer to convert the second phase signal received thereat to a sixth output signal;

- wherein the first, the second, and the third IF clock signals have a predefined phase relationship with respect to each other.

120
- combine the fourth and third output signals to form a first phase portion of the lower side band signal;

- combine the second and sixth output signals to form a second phase portion of the lower side band signal;

- combine the fourth and first output signals to form a first phase portion of the upper side band signal; and

- combine the second and fifth output signals to form a second phase portion of the upper side band signal.

210
- provide IF signals comprising a first phase signal and a second phase signal to a CIF mixer stage to be converted to baseband frequency signals comprising a lower side band signal and an upper side band signal, the CIF mixer stage comprising a first branch comprising first, second, and third mixers and a second branch comprising fourth, fifth, and sixth mixers; the first phase signal provided to the mixers of the first branch and the second phase signal provided to the mixers of the second branch;

- provide a first IF clock signal to the first mixer to convert the first phase signal received thereat to a first output signal;

- provide a second IF clock signal to the second mixer to convert the first phase signal received thereat to a second output signal;

- provide a third IF clock signal to the third mixer to convert the first phase signal received thereat to a third output signal;

- provide a fourth IF clock signal to the fourth mixer to convert the first phase signal received thereat to a fourth output signal;

- provide the second IF clock signal to the fifth mixer to convert the second phase signal received thereat to a fifth output signal;

- provide the third IF clock signal to the sixth mixer to convert the second phase signal received thereat to a sixth output signal;

- provide the first IF clock signal to the seventh mixer to convert the second phase signal received thereat to a seventh output signal;

- provide the fourth IF clock signal to the eighth mixer to convert the second phase signal received thereat to an eighth output signal;

wherein the first, the second, the third, and the fourth IF clock signals have a predefined phase relationship with respect to each other.

220
- combine the fifth and third output signals to form a first phase portion of the lower side band signal;

- combine the fourth and seventh output signals to form a second phase portion of the lower side band signal;

- combine the eighth and first output signals to form a first phase portion of the upper side band signal; and

- combine the second and sixth output signals to form a second phase portion of the upper side band signal.

COMPLEX INTERMEDIATE FREQUENCY MIXER STAGE AND CALIBRATION THEREOF

TECHNICAL FIELD

The present invention relates to a Complex Intermediate Frequency, CIF, mixer stage for a radio receiver, and particularly, to calibration of the CIF mixer stage to suppress image interference and IQ leakage in the CIF based receiver.

BACKGROUND

A conventional radio receiver converts, or down-converts, a Radio Frequency (RF) signal to an Intermediate Frequency (IF) signal, and subsequently converts the IF signal to a Baseband (BB) frequency signal. An exemplary architecture of such a receiver is depicted in FIG. 1. The receiver may be designed to receive and process two carriers simultaneously, although designs for other purposes or functions are also possible.

As illustrated in FIG. 1, a received RF signal is initially fed to a Low-Noise Amplifier (LNA). The amplified signal is subjected to a quadrature RF down-conversion where the frequency of the driving clock signal such as a local oscillator (LO) signal is set to the center of the two carriers such that the desired RF signals carried by the two carriers can be down-converted to IF signals having the same IF frequency. The complex output of the RF down-converter, including an In-phase (I) signal on the I-channel and a Quadrature-phase (Q) signal on the Q-channel, comprises the desired signals carried on both the carriers. The lower frequency signal appears on the negative side while the higher frequency signal appears on the positive side. Filters, such as band pass filters BPFi and BPFq shown in FIG. 1, are used to filter out the unwanted signals and suppress interference.

A complex mixer stage, or a complex mixer, such as the dual-carrier complex mixer illustrated in the middle of FIG. 1 is used to down-convert the two signals, the I-signal and the Q-signal, to baseband (BB). In other words, the I-signal and the Q-signal on the two carriers are down-converted to respective BB signals. The resulting BB signals are fed to Low Pass Filters (LPF 1-4) and Analogue-to-Digital Converters (ADC 1-4) for further processing. Eventually, as illustrated in FIG. 1, the dual carrier CIF mixer stage down-converts the dual carrier RF signals into quadrature Lower Side Band signals (LSI, LSQ) and quadrature Upper Side Band signals (USI, USQ). Here LS represents Lower Side band, US represents Upper Side band, and I and Q represent in-phase and quadrature-phase, respectively.

Note that FIG. 1 is a simplified view of the conventional receiver architecture with the purpose to exemplify the basic operation only. For ease of explanation, the components LNA, LPFs and ADCs are omitted in the discussion below. The basic architecture of the CIF based receiver shown in FIG. 1 can be simplified into the diagram of FIG. 2.

FIG. 2 presents an ideal case for a dual carrier CIF structure, where no IQ imbalance is assumed to be present. In other words, this CIF based receiver does not suffer from any phase or amplitude mismatch.

As can be seen in FIG. 2, the instantaneous phase of the first mixer stage, namely the RF mixer stage, is denoted as $\alpha = \omega_c t = 2\pi f_{LO1} t$, where $f_{LO1}$ is the frequency of the first driving clock signal, for the first mixer stage, and the instantaneous phase of the second mixer stage, or the IF mixer stage, is denoted as $\beta = \Omega t = 2\pi f_{LO2} t$, where $f_{LO2}$ is the frequency of the second driving clock signal, for the second mixer stage. Generally the first clock frequency is at RF frequency, and the second clock frequency is at IF frequency. The underlined text strings in the signal paths denote the path gains, which are the modulation factors along the signal paths introduced by the mixer multiplication operations. In the adder outputs, the path gains are $\sin(\alpha \pm \beta)$ and $\cos(\alpha \pm \beta)$ for the upper side band (with "+" sign) and the lower side band (with "−" sign), respectively. In the ideal case of FIG. 2, there is no crosstalk between the outputs. The combined paths for LSI, LSQ, USI and USQ have a pure sinusoid product in path gain.

When there is an RF input signal (so(t) in FIG. 2), the signal is multiplied by the path gain, and the resulting output is fed to an LPF (not shown in FIG. 2). All the outband interference signals are removed by the LPF, and only the desired inband signals remain at the output of the LPF. The above approach illustrates the general principle for down-converting an RF signal in the receiver.

In the ideal case for the dual carrier CIF structure, no IQ imbalance is assumed. However, in practice there exists mismatch in clock phase, clock amplitude, path gain, etc., and the mismatch will lead to IQ imbalance.

When there is mismatch in gain or phase for RF clock signals or in the path gains, it will lead to crosstalk or interference between the outputs. The mismatch impact can be analyzed as follows: in general, phase offsets can be added at two quadrature clocks, for example $\sin(\alpha + \Delta_1)$ and $\cos(\alpha + \Delta_2)$. However, since the common phase part is not of interest, so for simplicity only the differential part $\phi = \Delta_1 - \Delta_2$ can be added in one path, say in the quadrature phase clock $\cos(\alpha + \beta)$. Similarly, a gain error can be added in one path as $(1+\epsilon)$ with the gain of the other path assumed as 1. This gives a mismatch case shown in FIG. 3.

It is well known that RF quadrature mixers suffer from gain and phase imbalance and that the performance in this respect is usually determined, for example by measurement, as Image-Rejection Ratio IRR. For RF quadrature mixers the IRR is typically in the range of 30 to 40 dB. In the architecture described above a poor image rejection will lead to that the lower side carrier leaks into the upper side carrier and/or vice versa. Gain and phase imbalance can also be introduced by the IF filters and the complex mixers. If a strong image interference signal appears at the receiver front-end, for example a blocking signal, the image interference signal may mask the desired signal.

SUMMARY

Accordingly, there is a need for a solution that corrects for gain and phase imbalance introduced by RF mixers and/or IF mixers by using CIF mixers in CIF based radio receivers.

According to an apparatus aspect, a CIF mixer stage for converting, or downconverting, IF signals to baseband frequency is provided. The IF signals comprise a first phase signal and a second phase signal (the expression "first phase" may indicate, with respect to complex signals or signal portions, the in-phase, or I-phase, whereas the "second phase", the quadrature-phase, or the Q-phase). The first and second phase signals are converted to baseband frequency signals which comprise a lower side band signal and an upper side band signal. The CIF mixer stage comprises two branches for receiving the first and second phase signals, respectively. Along each branch, three mixers are arranged. Each mixer is configured to be driven by an IF clock signal to convert the first or second phase signal received at the mixer to an output signal. Specifically, along the first branch, a first mixer is configured to be driven by a first IF clock signal to convert the first phase signal to a first output signal; a second mixer is configured to be driven by a second IF clock signal to convert the first phase signal to a second output signal; and a third mixer is configured to be driven by a third IF clock signal to convert the first phase signal to a third output signal. Along the second branch, a fourth mixer is configured to be driven by the second IF clock signal to convert the second phase signal to a fourth output signal; a fifth mixer is configured to be driven by the third IF clock signal to convert the second phase signal to a fifth output signal; and a sixth mixer is configured to be driven by the first IF clock signal to convert the second phase signal to a sixth output signal. The first, second and third IF clock signals mentioned above have a predefined (but not necessarily fixed) phase relationship with respect to each other; such arrangement achieves to, among others, cancel the phase and amplitude imbalance introduced by the RF quadrature mixers. The CIF mixer stage further comprises four adders for combining the output signals from the first and second branches in order to form the lower side band signal and the upper side band signal. Specifically, the first adder combines the fourth and third output signals to form a first phase portion of the lower side band signal; the second adder combines the second and sixth output signals to form a second phase portion of the lower side band signal; the third adder combines the fourth and first output signals to form a first phase portion of the upper side band signal; and the fourth adder combines the second and fifth output signals to form a second phase portion of the upper side band signal.

It should be noted that the term "adder" refers to a device which can perform at least one of the functions of signal addition and subtraction. That is, the "adder" may also comprise subtraction functionalities. To say that an adder combines signals A and B may designate any one of the following operations: A+B, A−B, −A+B, −A−B.

The different IF clock signals referred to above, or a subset thereof, may be quadrature IF clock signals but with additional tuneable phase skews. These different clock signals may originate from a single clock or from different clocks, by a quadrature clock divider or a multiphase clock generator. Additional phase skew can be generated by inserting a tuneable RC delay, or a clock buffer with a tuneable delay. (For historical reasons the term local oscillator signal or LO signal are widely used for the clock signal driving a mixer. So the terms "LO signal" and "clock signal" are used interchangeably in this disclosure. However it should be noted that an LO signal does not have to be generated locally or directly from an oscillator). Nevertheless, various circuitry techniques allow phase adjustments so that the clock signals from a single clock can be modified into having different predefined phases with regard to each other. In the context of the present disclosure, phase difference, phase skew, phase deviation, and phase offset are used interchangeably.

An exemplary predefined phase relationship among the first, second, and third IF clock signals may be the following: the first IF clock signal and the second IF clock signal have a phase difference of generally 90 degrees, and, additionally, a phase skew ($\theta 1$), or phase deviation, or phase offset, with respect to each other; the third IF clock signal and the second IF clock signal have a phase difference of generally 90 degrees and another additional phase skew ($\theta 2$) with respect to each other. The additional phase skews $\theta 1$ and $\theta 2$ are tuneable.

According to another apparatus aspect, a CIF mixer stage for converting IF signals to baseband is provided. The IF signals comprise a first phase signal and a second phase signal which are converted by the CIF mixer stage to baseband frequency signals which comprise a lower side band signal and an upper side band signal. The CIF mixer stage comprises a first and second branches for receiving the first phase signal and the second phase signal, respectively. The first branch comprises four mixers configured to be driven by IF clock signals to convert the first phase signal received thereat to four output signals respectively: the first mixer is configured to be driven by a first IF clock signal to convert the first phase signal to a first output signal; the second mixer is configured to be driven by a second IF clock signal to convert the first phase signal to a second output signal; the third mixer is configured to be driven by a third IF clock signal to convert the first phase signal to a third output signal; and the fourth mixer is configured to be driven by a fourth IF clock signal to convert the first phase signal to a fourth output signal. Analogously, the second branch comprises another four mixers configured to be driven by the same IF clock signals above to convert the second phase signal received thereat to another four output signals respectively: the fifth mixer is configured to be driven by the second IF clock signal to convert the second phase signal to a fifth output signal; the sixth mixer is configured to be driven by the third IF clock signal to convert the second phase signal to a sixth output signal; the seventh mixer is configured to be driven by the first IF clock signal to convert the second phase signal to a seventh output signal; and the eighth mixer is configured to be driven by the fourth IF clock signal to convert the second phase signal to an eighth output signal. The first, second, third, and fourth IF clock signals have a predefined (but not necessarily fixed) phase relationship with respect to each other. The CIF mixer stage further comprises four adders for combining the output signals from the first and second branches in order to form the lower side band signal and the upper side band signal. Specifically, the first adder combines the fifth and third output signals to form a first phase portion of the lower side band signal; the second adder combines the fourth and seventh output signals to form a second phase portion of the lower side band signal; the third adder combines the eighth and first output signals to form a first phase portion of the upper side band signal; and the fourth adder combines the second and sixth output signals to form a second phase portion of the upper side band signal.

Regarding the first, second, third, and fourth IF clock signals, the same techniques for clock signal generation and phase adjustment as discussed above may be employed. The "predefined phase relationship" among the first, second, third, and fourth IF clock signals may be the following: the second IF clock signal and the fourth IF clock signal have the same phase; the first IF clock signal and the second IF clock signal have a phase difference of generally 90 degrees and a first additional phase skew ($\theta 1$) with respect to each other; and the third IF clock signal and the second IF clock signal have a phase difference of generally 90 degrees and a second additional phase skew ($\theta 2$) with respect to each other. Alternatively, the predefined phase relationship may be that the third IF clock signal and the fourth IF clock signal have a phase difference of generally 90 degrees with respect to each other; the first IF clock signal and the third IF clock signal have a first additional phase skew ($\theta 1$) with respect to each other; and that the second IF clock signal and the fourth IF clock signal have a second additional phase skew ($\theta 2$) with respect to each other. The phase skews may be tuneable.

With respect to the CIF mixer stage according to either one of the apparatus aspects above, at least one of the individual mixers comprised in the CIF mixer stage may further comprise a control unit (Ctrl) for enabling or disabling the mixers to mix the part of the IF signals received with the respective IF clock signal.

The CIF mixer stage may further comprise a gain calibrator for calibrating the conversion gain of at least one of the mixers within the CIF mixer stage. The conversion-gain calibration for a mixer may be achieved with gain calibrators of different implementations. In one implementation, gain calibration for the mixer may be realized by a plurality of mixing units (small mixers) arranged in the mixer in parallel whereby each mixing unit comprises an enable/disable control unit. In another implementation, gain calibration for the mixer can be achieved by changing a power supply of a clock driver of the respective IF clock signal and/or changing the clock swing of the respective IF clock signal. Other implementations of the gain calibrator are also possible. For further calibration of the conversion gain of a mixer, another control unit (Gcal) may be provided in the CIF mixing stage for (fine) tuning the conversion gain of the mixer.

Besides a gain calibrator, a phase calibrator may be provided in the CIF mixer stage. Among many feasible solutions, a phase skew unit may be included in the CIF mixer stage for calibrating the phase of at least one of the IF clock signals. The phase skew unit may comprise at least one delay clock buffer adapted to calibrate the phase of at least one of the IF clock signals by adjusting the supply voltage of the clock buffer. The phase skew unit may be designed in various ways. For example, it may comprise at least one delay clock buffer which can calibrate the phase of at least one of the IF clock signals by adjusting a supply voltage of the clock buffer.

The CIF mixer stage may further comprise an IQ leakage correction unit for removing in-channel, or in-band, leakage. In-band leakage refers to desired in-band in-phase signal leaking to a desired in-band quadrature-phase signal, or vice versa. In-band leakage degrades the Error Vector Magnitude (EVM). The IQ leakage correaction unit may be adapted to remove, from the first phase portion of the lower side band signal, the IQ leakage caused by the second phase portion of the lower side band signal. The same or another IQ leakage correction unit may also be used to remove, from the first phase portion of the upper side band signal, the IQ leakage caused by the second phase portion of the upper side band signal.

The CIF mixer stage may be incorporated in a radio receiver, thus providing a radio receiver comprising the CIF mixer stage. The CIF mixer stage may be integrated within a dual-carrier radio receiver and adapted to operate in a full mode; i.e., both the upper side band and the lower side band of the CIF mixer stage are operational. Alternatively, the CIF mixer stage can be integrated within a single-carrier radio receiver and adapted to operate in an "half mode"; i.e., the CIF mixer stage operates at only one of the upper side band and the lower side band.

Corresponding to the two apparatus aspects above, methods for operating the CIF mixer stages are also provided. According to a first method aspect, operation of a CIF mixer stage according to the first apparatus aspect to convert IF signals to baseband frequency may involve the following specifics: The IF signals to be converted comprise a first phase signal and a second phase signal. The IF signals are to be converted to baseband frequency signals comprising a lower side band signal and an upper side band signal. The CIF mixer stage comprises a first branch comprising first, second and third mixers and a second branch comprising fourth, fifth and sixth mixers.

The operation method comprises the following steps: providing the first phase signal of the IF signals to the mixers of the first branch and the second phase signal of the IF signals to the mixers of the second branch; providing a first IF clock signal to the first mixer to convert the first phase signal received at the first mixer to a first output signal; providing a second IF clock signal to the second mixer to convert the first phase signal received at the second mixer to a second output signal; providing a third IF clock signal to the third mixer to convert the first phase signal received at the third mixer to a third output signal; providing the second IF clock signal to the fourth mixer to convert the second phase signal received at the fourth mixer to a fourth output signal; providing the third IF clock signal to the fifth mixer to convert the second phase signal received at the fifth mixer to a fifth output signal; providing the first IF clock signal to the sixth mixer to convert the second phase signal received at the sixth mixer to a sixth output signal; combining the fourth and third output signals to form a first phase portion of the lower side band signal; combining the second and sixth output signals to form a second phase portion of the lower side band signal; combining the fourth and first output signals to form a first phase portion of the upper side band signal; and combining the second and fifth output signals to form a second phase portion of the upper side band signal.

In the above, the first, the second, and the third IF clock signals have a predefined phase relationship with respect to each other. The predefined phase relationship may be the following: the first IF clock signal and the second IF clock signal have a phase difference of generally 90 degrees and an additional phase skew ($\theta 1$) with respect to each other; and the third IF clock signal and the second IF clock signal have a phase difference of generally 90 degrees and another additional phase skew ($\theta 2$) with respect to each other. The additional phase skews may be tuneable.

According to another method aspect, which corresponds to the CIF mixer stage of the second apparatus aspect mentioned above, a method is provided for operating a complex intermediate frequency, CIF, mixer stage to convert intermediate frequency, IF, signals comprising a first phase signal and a second phase signal to baseband frequency signals comprising a lower side band signal and an upper side band signal. The CIF mixer stage comprises a first branch comprising first, second, third, and fourth mixers and a second branch comprising fifth, sixth, seventh and eighth mixers. The method comprises the following steps: providing the first phase signal of the IF signals to the mixers of the first branch and the second phase signal of the IF signals to the mixers of the second branch; providing a first IF clock signal to the first mixer to convert the first phase signal received at the first mixer to a first output signal; providing a second IF clock signal to the second mixer to convert the first phase signal received at the second mixer to a second output signal; providing a third IF clock signal to the third mixer to convert the first phase signal received at the third mixer to a third output signal; providing a fourth IF clock signal to the fourth mixer to convert the first phase signal received at the fourth mixer to a fourth output signal; providing the second IF clock signal to the fifth mixer to convert the second phase signal received at the fifth mixer to a fifth output signal; providing the third IF clock signal to the sixth mixer to convert the second phase signal received at the sixth mixer to a sixth output signal; providing the first IF clock signal to the seventh mixer to convert the second phase signal received at the seventh mixer to a seventh output signal; providing the fourth IF clock signal to the eighth mixer to convert the second phase signal received at the eighth mixer to an eighth output signal; combining the fifth and third output signals to form a first phase portion of the lower side band signal; combining the fourth and seventh output signals to form a second phase portion of the lower side band signal; combining the eighth and first output signals to form a first phase portion of the upper side band signal; and combining the second and sixth output signals to form a second phase of the upper side band signal. In the above, the first, the second, the third, and the fourth IF clock signals have a predefined phase relationship with respect to each other.

The predefined phase relationship may be the following: the second IF clock signal and the fourth IF clock signal have the same phase; the first IF clock signal and the second IF clock signal have a phase difference of generally 90 degrees and a first additional tuneable phase skew ($\theta 1$) with respect to each other; and the third IF clock signal and the second IF clock signal have a phase difference of generally 90 degrees and a second additional tuneable phase skew ($\theta 2$) with respect to each other. Alternatively, the predefined phase relationship may be that the third IF clock signal and the fourth IF clock signal have a phase difference of generally 90 degrees; the first IF clock signal and the third IF clock signal have a first additional tuneable phase skew ($\theta 1$) with respect to each other; and the second IF clock signal and the fourth IF clock signal have a second additional tuneable phase skew ($\theta 2$) with respect to each other.

The method according to either one of the above method aspects may further comprise a step of removing, from the first phase portion of the lower side band signal, the IQ leakage caused by the second phase portion of the lower side band signal, and/or a step of removing, from the first phase portion of the upper side band signal, the IQ leakage caused by the second phase portion of the upper side band signal.

According to a further method aspect, a method for calibrating a CIF mixer stage according to either one of the apparatus aspects presented above comprises the following steps: providing IF signals to the CIF mixer stage wherein the IF signals comprises a first phase signal and a second phase signal; enabling the mixers of the CIF mixer stage to convert the IF signals to baseband frequency signals which comprise a lower side band signal and an upper side band signal; measuring the conversion gains for the lower side band and upper side band signals resulted from the conversion; calibrating the conversion gains of the mixers of the CIF mixer stage such that the mixers have an equal conversion gain; and calibrating the phase of at least one of the IF clock signals so that the first and second portions of the lower side band signal formed by the CIF mixer stage become minimum while the first and second portions of the upper side band signals formed by the CIF mixer stage are maintained at maximum.

The calibration of the phase of the at least one IF clock signal may be realized by calibrating the phase skews between the IF clock signals, such as between the IF clock signal in question and one or more of certain other IF clock signals.

The method may further comprise determining whether the amplitudes of the first and second portions of the lower side band signal are less than a predefined leakage level, or threshold. If it is determined that the amplitudes of the first and second portions of the lower side band signal are less than the predefined threshold, the method may further comprise repeating the steps of conversion gain calibration and phase calibration. If it is determined at a certain round that the amplitudes of the first and second portions of the lower side band signal are not less than the predefined leakage threshold, the method may further comprise removing, from the first phase portion of the lower side band signal, the IQ leakage caused by the second phase portion of the lower side band signal and/or removing, from the first phase portion of the upper side band signal, the IQ leakage caused by the second phase portion of the upper side band signal.

Amplitude determination of the first and second portions of the upper side band signal may be performed as well, and possibly in the same way as for the lower side band signal.

The IQ leakage can be removed by numerous measures. One of such measures may comprise determining a phase difference between the first and second phase portions of the lower side band signal and/or a phase difference between the first and second phase portions of the upper side band signal; creating an IQ leakage decoupling matrix based on at least one of the determined phase differences; and applying the IQ leakage decoupling matrix to the first phase portion of the lower side band signal to remove the IQ leakage caused by the second phase portion of the lower side band signal and/or applying the IQ leakage decoupling matrix to the first phase portion of the upper side band signal to remove the IQ leakage caused by the second phase portion of the upper side band signal.

The leakage decoupling matrix may be applied to the first phase portion of the upper side baseband signal and/or to the first phase portion of the lower side baseband signal in either an analogue domain or a digital domain. It may be applied to both the first phase portion of the lower side baseband signal and to the first phase portion of the upper side baseband signal either in a parallel manner or a time interleaving manner.

BRIEF DESCRIPTION OF THE DRAWINGS

In the following, exemplary CIF mixer stages and the related operational methods are described with reference to the exemplary embodiments illustrated in the drawings, wherein:

FIG. 9 is a flow diagram showing a method embodiment of operating a CIF mixer stage;

FIG. 10 is a flow diagram showing another method embodiment of operating a CIF mixer stage;

DETAILED DESCRIPTION

The present disclosure explores the techniques for removing, or at least suppressing, IQ imbalance caused by, among others, mixer mismatch and clock imperfections. A basic principle is to cancel the gain and phase imbalances introduced in the RF mixer stage and/or the IF mixer stage by, among others, introducing conversion gain control and phase control for the IF clock signals. In other words, calibration of gain and IF clock signal phase in the individual mixers, or mixer cores, of the IF mixer stage is performed in order to correct for gain and phase imbalances in both RF and IF mixer stages. Preferably the calibration is done only in the complex mixer signal path where operation frequency is lower than typical RF frequencies.

In the following description, for purposes of explanation and not limitation, specific details are set forth, such as particular sequences of steps, layout of input/output interfaces and application of clock signals, in order to provide a thorough understanding of the presented CIF mixer stages. It will be apparent to those skilled in the art that the CIF mixer stages and related methods may be implemented in other embodiments that depart from these specific details.

Moreover, those skilled in the art will appreciate that the functions explained herein below may be, completely or in part, implemented using software functioning in conjunction with a programmed microprocessor or general purpose computer. It will also be appreciated that while the CIF mixer stage technique is primarily described in the form of methods and apparatuses, the technique may also be embedded at least partially in a computer program product as well as in a system comprising a computer processor and a memory coupled to the processor, wherein the memory is encoded with one or more programs that may perform the function disclosed herein.

Figure 3:
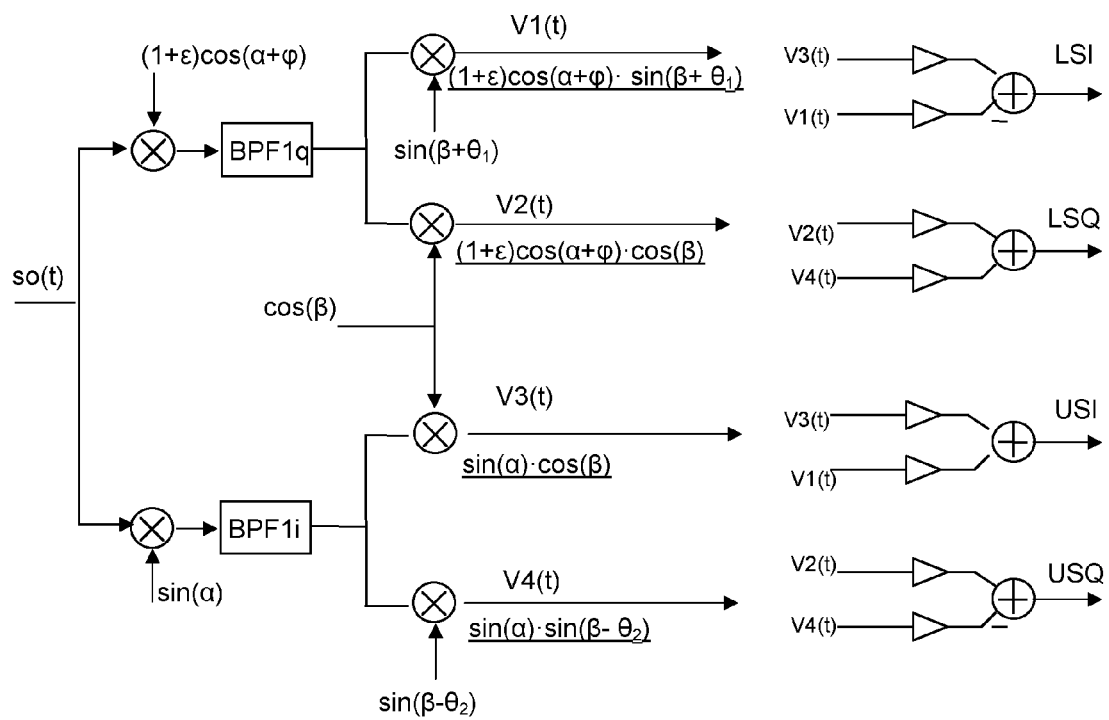
FIG. 3 is a diagram showing an example of a mismatched conventional CIF based receiver.

Referring to the mismatch model described in FIG. 3, it is assumed that RF quadrature mixers introduce phase and/or amplitude imbalances between channels, and that the CIF mixers also have phase and/or amplitude mismatches themselves but that the phase of the IF driving clock and the conversion gains of the CIF mixers are tuneable. As discussed in detail below, the IQ imbalance introduced at least by the RF quadrature mixers is reduced by tuning the phase skew of the clock driver of the CIF quadrature mixers and tuning the conversion gains of the CIF quadrature mixers. The tuneable parameters may find themselves inside the analogue circuit domain, and the calibration method may be implemented in a digital domain.

1. RF Quadrature Down-Converter Imbalances

Referring to the mismatch model described in FIG. 3, phase skews $\theta_1$ and $\theta_2$ may include a clock-skew part and a tuneable part; for example, $\theta_1 = \theta_1 s + \Delta\theta_1$, and $\theta_2 = \theta_2 s + \Delta\theta_2$, where $\theta_1 s$ and $\theta_2 s$ represent clock-skew parts while $\Delta\theta_1$ and $\Delta\theta_2$ indicate tuneable parts on the CIF mixer clock paths, respectively. In certain implementations, phase skews $\theta_1$ and $\theta_2$ may be tuned individually to eliminate the image signals.

Based on the mismatch model in FIG. 3, the output of USI can be written as follows:

$$USI = V1(t) + V3(t) = (1+\varepsilon) \cdot g_1 \cdot \cos(\alpha+\varphi)\sin(\beta+\theta_1) + \quad (1)$$

$$g_3 \sin(\alpha)\cos(\beta)$$

$$= \frac{K_3 + K_1 \cos(\varphi+\theta_1)}{2}\sin(\alpha+\beta) +$$

$$\frac{K_3 - K_1 \cos(\varphi-\theta_1)}{2}\sin(\alpha-\beta) +$$

$$\frac{K_1}{2}\sin(\theta_1-\varphi)\cos(\alpha-\beta) + \frac{K_1}{2}\sin(\theta_1+\varphi)\cos(\alpha+\beta)$$

where $K_1 = g_1(1+\varepsilon)$ and $K_3 = g_3$, and $g_1$ and $g_3$ indicate conversion gain factors.

Figure 1:
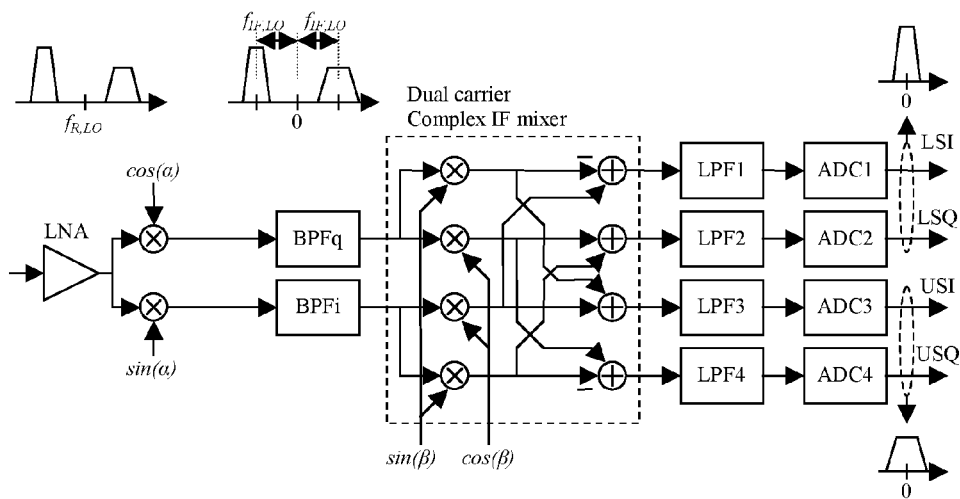
FIG. 1 is a block diagram showing the basic architecture of a conventional CIF based receiver.
Figure 2:
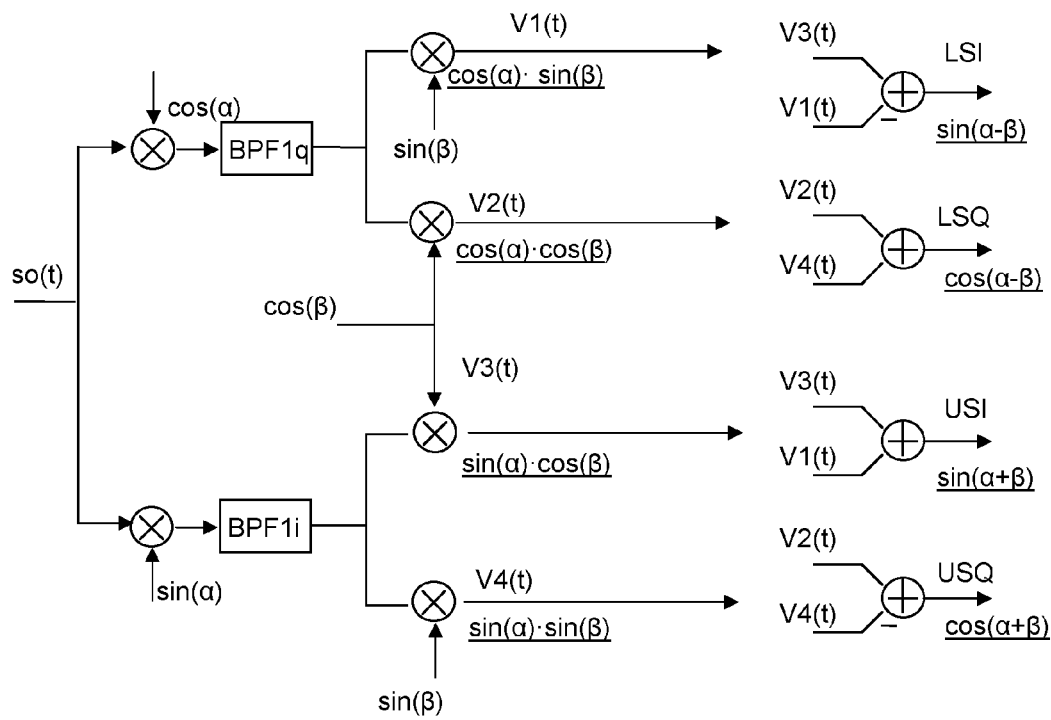
FIG. 2 is a diagram showing a simplified overview of the conventional CIF based receiver of FIG. 1.

From Equation (1) and FIG. 2, the wanted path product is $\sin(\alpha+\beta)$, but the coefficients for the unwanted terms $\cos(\alpha+\beta)$, $\sin(\alpha-\beta)$, and $\cos(\alpha-\beta)$ may also exist; i.e., the coefficients are not zero. These coefficients represent leakage ratios. For example, the coefficient for the term $\cos(\alpha+\beta)$ represents IQ crosstalk or leakage inside the in-phase channel for the upper side band, and the coefficients for the terms $\sin(\alpha-\beta)$ and $\cos(\alpha-\beta)$ represent the leakage ratios for the image channels, i.e., for the lower side band.

Similarly, the following can be expressed for USQ:

$$USQ = V2(t) - V4(t) = (1+\varepsilon)g_2\cos(\alpha+\varphi)\cos(\beta) - \quad (2)$$

$$g_4 \sin(\alpha)\sin(\beta-\theta_2)$$

$$= \frac{K_2\cos(\varphi) + K_4\cos(\theta_2)}{2}\cos(\alpha+\beta) +$$

$$\frac{K_2\cos(\varphi) - K_4\cos(\theta_2)}{2}\cos(\alpha-\beta) +$$

$$\frac{K_4\sin(\theta_2) - K_2\sin(\varphi)}{2}[\sin(\alpha-\beta) + \sin(\alpha+\beta)]$$

In a similar way, the in-phase component of the lower side band signal may be expressed as $$LSI = V3(t) - V1(t) = g_3\sin(\alpha)\cos(\beta) - \quad (3)$$

$$(1+\varepsilon)g_1\cos(\alpha+\varphi)\cos(\beta+\theta_1)$$

$$= \frac{L_3 + L_1\cos(\varphi-\theta_1)}{2}\sin(\alpha-\beta) +$$

$$\frac{L_3 - L_1\cos(\varphi+\theta_1)}{2}\sin(\alpha+\beta) -$$

$$\frac{L_1\sin(\theta_1-\varphi)}{2}\cos(\alpha-\beta) - \frac{L_1\sin(\theta_1+\varphi)}{2}\cos(\alpha+\beta)$$

and the quadrature phase component as $$LSQ = V2(t) + V4(t) = g_2\cos(\alpha+\varphi)\cos(\beta) + \quad (4)$$

$$g_4\sin(\alpha)\cos(\beta-\theta_2)$$

$$= \frac{L_2\cos(\varphi) + L_4\cos(\theta_2)}{2}\cos(\alpha-\beta) +$$

$$\frac{L_2\cos(\varphi) - L_4\cos(\theta_2)}{2}\cos(\alpha+\beta) -$$

$$\frac{L_2\sin(\varphi) + L_4\sin(\theta_2)}{2}[\sin(\alpha+\beta) + \sin(\alpha-\beta)]$$

To remove the upper side channel image leakage, let $$K_1 = K_2 = K_3 = K_4 = K, \text{ and } \phi = \theta_2 = \theta_1 \quad (5)$$

Then equations (1) and (2) will become $$USI = \frac{K[1+\cos(2\varphi)]}{2}\sin(\alpha+\beta) + \frac{K\sin(2\varphi)}{2}\cos(\alpha+\beta) \quad (6)$$

and $$USQ = K\cos(\varphi)\cos(\alpha+\beta) \quad (7)$$

Equation (5) suggests a condition for receiving the upper side band signals without any image interference from the lower side band; this means that the leakage ratio for the lower side band would be zero. However, the second item of Equation (6) indicates the existence of IQ crosstalk from wanted signals. Therefore a further procedure may be desirable. Equation (6) and Equation (7) can be expressed in a matrix A of type 2×2 as $$US = \frac{K}{2}A\begin{bmatrix} \sin(\alpha+\beta) \\ \cos(\alpha+\beta) \end{bmatrix} = \frac{K}{2}\begin{bmatrix} 1+\cos(2\varphi), & \sin(2\varphi) \\ 0, & 2\cos(\varphi) \end{bmatrix}\begin{bmatrix} \sin(\alpha+\beta) \\ \cos(\alpha+\beta) \end{bmatrix} \quad (8)$$

To separate the quadrature components, an IQ leakage decoupling circuitry may be designed to perform a decoupling matrix operation. The decoupling matrix is denoted as B, and it is the inverse of matrix A; that is, the matrix B can be expressed as $$B = A^{-1} = \begin{bmatrix} b_{11}, & b_{12} \\ 0, & b_{22} \end{bmatrix} = \begin{bmatrix} \frac{2}{1+\cos(2\varphi)}, & \frac{-2\sin(\varphi)}{1+\cos(2\varphi)} \\ 0, & \frac{1}{\cos(\varphi)} \end{bmatrix} \cong \begin{bmatrix} 1, & -\varphi \\ 0, & 1 \end{bmatrix} \quad (9)$$

The quadrature components of the upper side band signals may have the same average amplitude, and in normal receiver designs it is preferably not to interfere with each other. Hence the operation of Equation (9) can be executed in either an analogue domain or a digital domain.

The lower side band may be treated in the same fashion to remove image interference and IQ leakage. If the following conditions are met for Equation (3) and Equation (4)

$$L_1=L_2=L_3=L_4=K, \text{ and } \phi=-\theta_1=-\theta_2 \quad (10)$$

the image signal leakage ratio in Equation (3) and Equation (4) will be zero, meaning that the image interference from the upper side band will no longer influence the lower side band. As such, Equation (3) and Equation (4) may be re-written as:

$$LSI = \frac{K[1+\cos(2\varphi)]}{2}\sin(\alpha-\beta) + \frac{K\sin(2\varphi)}{2}\cos(\alpha-\beta) \quad (11)$$

and $$LSQ = K\cos(\varphi)\cos(\alpha-\beta) \quad (12)$$

The above can also be expressed in a matrix of type 2×2; namely, $$LS = \frac{K}{2}C\begin{bmatrix} \sin(\alpha-\beta) \\ \cos(\alpha-\beta) \end{bmatrix} = \frac{K}{2}\begin{bmatrix} 1+\cos(2\varphi), & \sin(2\varphi) \\ 0, & 2\cos(\varphi) \end{bmatrix}\begin{bmatrix} \sin(\alpha-\beta) \\ \cos(\alpha-\beta) \end{bmatrix} \quad (13)$$

It is obvious that C=A. This means that the same matrix B may be used to remove the IQ leakage of both the lower and upper side band signals, and this knowledge can help to simplify hardware design. For example, if implemented in the analogue domain, the decoupling circuitry may be designed with the same design parameters; if such decoupling is processed in the digital domain, it may be implemented either in a paralleled structure or a time interleaving structure.

The conditions laid out in Equations (5) and (10) for removing image leakage ratio for the upper side band and the lower side band suggest that more than one CIF mixer cores, or individual mixers, or simply "mixers", may be used to remove both upper side band and lower side band image interference.

2. Architecture of CIF Mixer Stage

Figure 4:
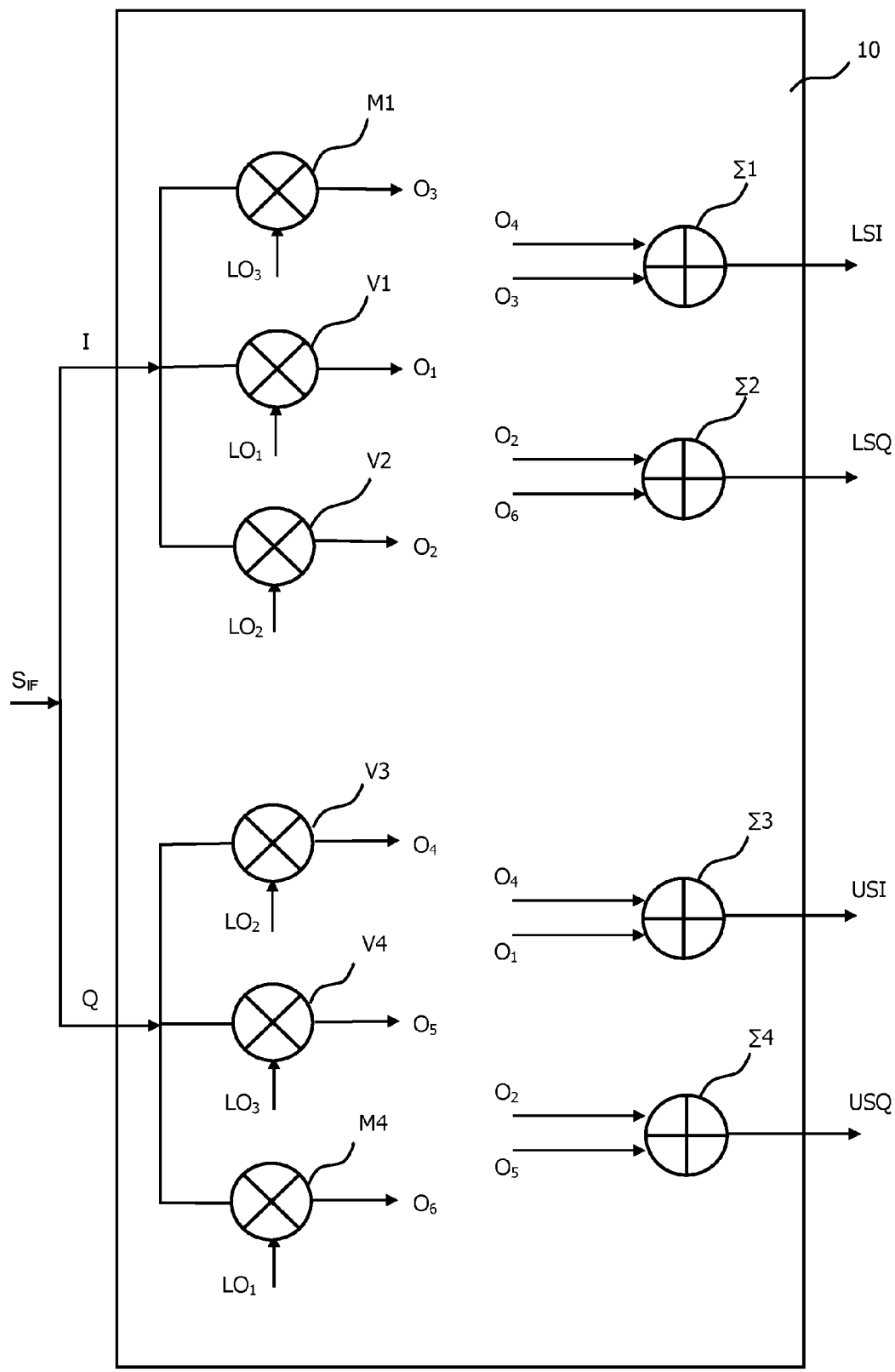
FIG. 4 is a block diagram showing a CIF mixer stage according to a first embodiment.

To at least suppress the IQ imbalance discussed above, a novel CIF mixer stage is provided and a simplified, abstract overview of its architecture is illustrated in FIG. 4.

The CIF mixer stage, denoted as 10 in FIG. 4, is configured to convert input IF signals to baseband frequency. The IF signals, shown on the left side of FIG. 4 and denoted as "$S_{IF}$", comprise a first phase signal, "I", and a second phase signal, "Q". Such IF signals may come from an RF mixer stage of a radio receiver or any suitable RF signal source. The two phase signals I and Q may represent the in-phase and the quadrature-phase of $S_{IF}$, respectively. By means of the CIF mixer stage 10, the first and second phase signals shall be converted to a set of baseband signals which comprise a lower side band signal and an upper side band signal. The in-phase and quadrature-phase portions of the intended lower side band and upper side band signals are respectively denoted as LSI, LSQ, USI, and USQ as shown in FIG. 4.

As shown in FIG. 4, the CIF mixer stage 10 comprises two branches for receiving the input first and second phase signals, respectively. The first branch for receiving the first phase signal I comprises three mixers, M1, V1, and V2. Each mixer is configured to be driven by a certain IF clock signal to convert the received first phase signal I to a respective output signal. Specifically, the first mixer V1 is to be driven by a first IF clock signal $LO_1$ (also input to V1) to convert the first phase signal I to a first output signal $O_1$; the second mixer V2 is configured to be driven by a second, IF clock signal, $LO_2$, to convert the first phase signal I to a second output signal, $O_2$, and the third mixer M1 is configured to be driven by a third IF clock signal, $LO_3$, to convert the first phase signal I to a third output signal, $O_3$. The scenario at the second branch is similar: another three mixer, namely, the fourth mixer V3, the fifth mixer V4, and the sixth mixer M4 are arranged on the second branch. The fourth mixer V3 is configured to be driven by the second IF clock signal mentioned above, $LO_2$, to convert the second phase signal Q received thereat to a fourth output signal $O_4$; the fifth mixer V4 is configured to be driven by the third IF clock signal, $LO_3$, to convert the received second phase signal Q to a fifth output signal, $O_5$; and the sixth mixer M4 is configured to be driven by the first IF clock signal, $LO_1$, to convert the second phase signal Q to a sixth output signal, $O_6$.

A certain phase relationship is predefined for the first, second and third IF clock signals. For instance, the first and second IF clock signals, $LO_1$ and $LO_2$, may be different from each other in-phase by generally (nominally) 90 degrees plus an additional skew ($\theta_1$); and the third and the second LO signals, $LO_3$ and $LO_2$, have a phase difference of generally (nominally) 90 degrees and another additional skew ($\theta_2$) with respect to each other. The additional phase skews $\theta_1$ and $\theta_2$ are tuneable.

The CIF mixer stage 10 further comprises a plurality of adders Σ1, Σ2, Σ3, and Σ4 to combine the signals output from the first and second branches in order to form the desired lower side band and upper side band signals. The first adder Σ1 combines the fourth and third output signals, $O_4$ and $O_3$, to form a first phase portion, e.g., the in-phase portion, of the lower side band signal LSI; the second adder Σ2 combines the second and sixth output signals, $O_2$ and $O_6$, to form a second phase portion, e.g., the quadrature-phase, of the lower side band signal LSQ; the third adder Σ3 combines the fourth and first output signals, $O_4$ and $O_1$, to form a first phase portion, e.g., the in-phase portion of the upper side band signal USI, and the fourth adder Σ4 combines the second and fifth output signals, $O_2$ and $O_5$, to form a second phase portion, e.g., the quadrature-phase portion, of the upper side band signal USQ.

The different IF clock signals referred to above, or a subset thereof, are quadrature IF clock signals but with additional tuneable phase skews. and the different clock signals may originate from a single LO clock or from different LO clocks, by a quadrature clock divider or a multiphase clock generator. Additional phase skew can be generated by inserting a tuneable RC delay, or a clock buffer with a tuneable delay. (For historical reason the term local oscillator signal or LO signal are widely used for the clock signal driving a mixer. So the terms "LO signal" and "clock signal", are used interchangeably in this disclosure. However it should be noted that an LO signal does not have to be generated locally or directly from an oscillator). Nevertheless, various circuitry techniques allow phase adjustments so that the clock signals from a single clock can be modified into having different predefined phases with regard to each other. In the context of the present disclosure, phase difference, phase skew, phase deviation, and phase offset are used interchangeably. If two or more IF clock signals are generated from a single clock, they may initially have the same phase, which can be adapted into different phases by phase-adjustment means such as a quadrature clock divider, a multiphase clock generator, or else. Phase adjustment can be achieved by various techniques, e.g., by inserting a tuneable delay unit either active or passive. An active tuneable delay unit can be implemented with a clock buffer having a tuneable delay, and a passive tuneable delay unit can be implemented with a tuneable RC network.

The "abstract" architecture of the CIF mixer stage 10 shown in FIG. 4 may be realized in many suitable implementations. An example of such an implementation is presented in FIG. 4A, where the layout of the six individual mixers and the four adders as well as the signal flowing are analogous to those in FIG. 4.

Figure 4A:
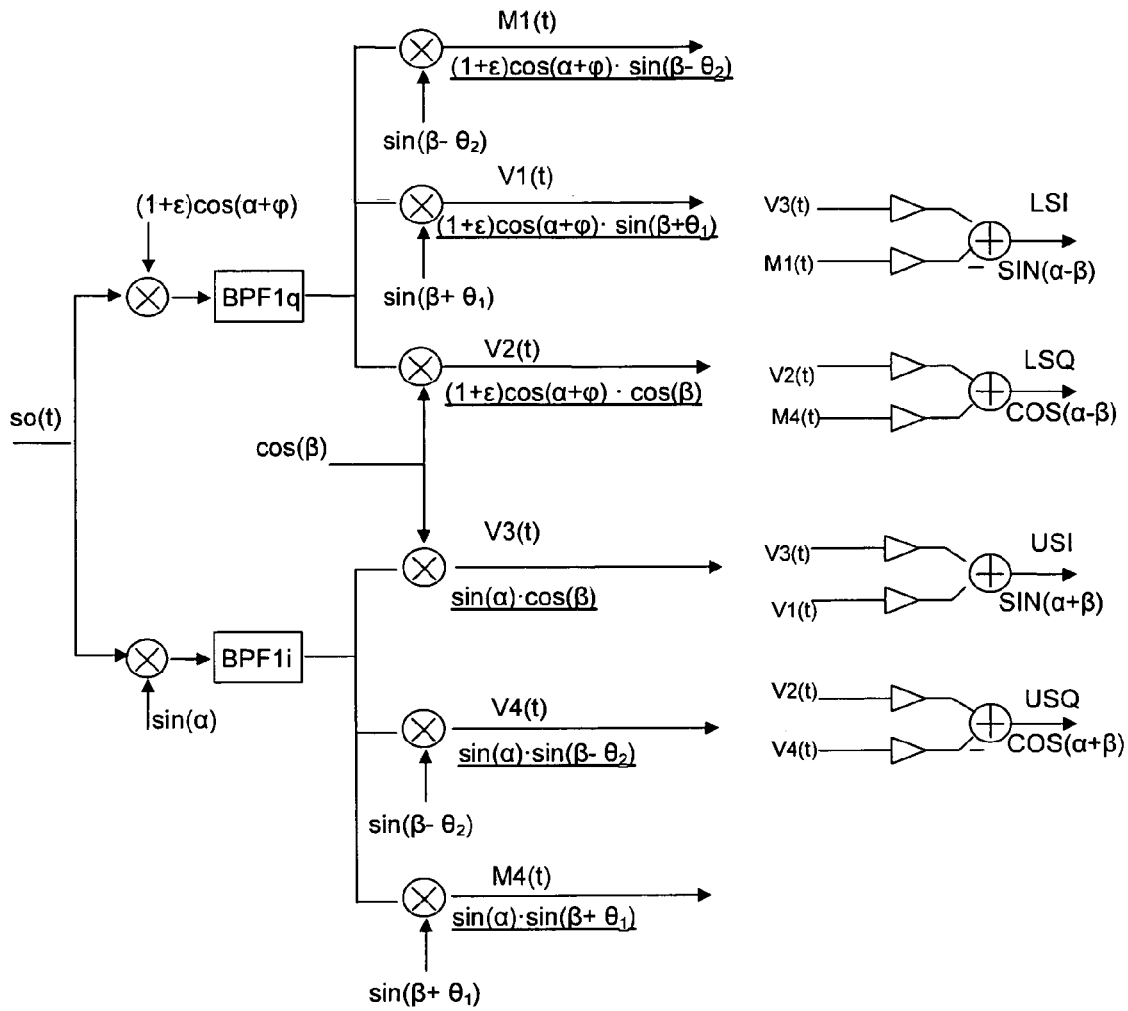
FIG. 4A is a block diagram showing another CIF mixer stage embodiment.

As can be seen, the IF signals input to the CIF mixer stage of FIG. 4A resemble those in FIG. 3 where phase and/or amplitude imbalance introduced by certain RF quadrature mixers has been considered. Further, the conversion gains along the paths of the six mixers (see the underlined text strings) indicate the influence of the phase and/or amplitude mismatches of the CIF mixers themselves.

With respect to the IF clock signals driving the mixers, respectively denoted as $\sin(\beta+\theta 1)$, $\cos(\beta)$, and $\sin(\beta-\theta 2)$ and resembling the first, second, and third IF clock signals as described above for FIG. 4, may originate from a same LO driving clock $\cos(\beta)$, whose phase is tuneable. The conversion gains of the six CIF mixers are tuneable as well.

It can be seen that $\theta_1 = \theta_2 + \Delta\theta$ and $\Delta\theta$ is a phase skew due to implementation imperfection. Since absolute phases in IF mixers do not influence IQ imbalance and could be treated just like propagation delay, only the relative phase skew has an impact on IQ imbalance. Note that the absolute phases $\theta_1$ and $\theta_2$ may also include IF clock generation/delivering skew mismatches. All IF clock phase is referred to as the clock phase $\cos(\beta)$, i.e., the clock phase $\cos(\beta)$ is taken as a reference phase.

Figure 5:
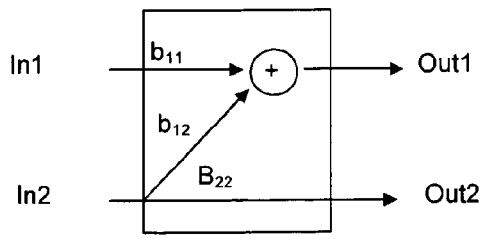
FIG. 5 is a block diagram showing an in-band IQ leakage correction unit.

Usually the frequency of the IF clock ($f_{LO2}$) is very low, thus the phase skew may be ignored. In this case, if on each signal path the conversion gain of cascaded mixers is calibrated, and the IF clock signal phases are set as $\theta_1 = \theta_2 = \phi$, the image interference will be removed. An additional procedure, IQ leakage decoupling, may be implemented as shown in FIG. 5, using the elements defined in Equation (9). FIG. 5 illustrates an IQ leakage correction unit for removing in-band leakage, which means wanted in-phase signal leaking to wanted quadrature-phase signal or vice versa. In-band leakage is undesirable because it degrades the Error Vector Magnitude (EVM). The IQ leakage correction unit may be incorporated in the CIF mixer stage and works to remove, from the first phase portion of the lower side band signal, the IQ leakage caused by the second phase portion of the lower side band signal. The same or another IQ leakage correction unit may also be used to remove, from the first phase portion of the upper side band signal, the IQ leakage caused by the second phase portion of the upper side band signal.

The architectures presented in FIG. 4 and FIG. 4A can be used to model generalized mismatch scenarios, covering both phase and amplitude mismatch in both RF and IF mixer stages of a radio receiver.

It can be seen that the hardware structures in FIG. 4 and FIG. 4A are not symmetric in mixer loading where the outputs from mixers V2 and V3 are used twice at the adders as inputs. Particularly in FIG. 4A, at the IF stage the quadrature clock $\cos(\beta)$ eventually drives four mixers while the in-phase clocks $\sin(\beta+\theta 1)$ and $\sin(\beta-\theta 2)$ only drive two mixers each. The unsymmetrical loading may potentially lead to a certain mismatch. The unsymmetrical structure may be improved by adding dummy mixers, e.g., two extra mixers, to balance the driving ability.

Figure 6:
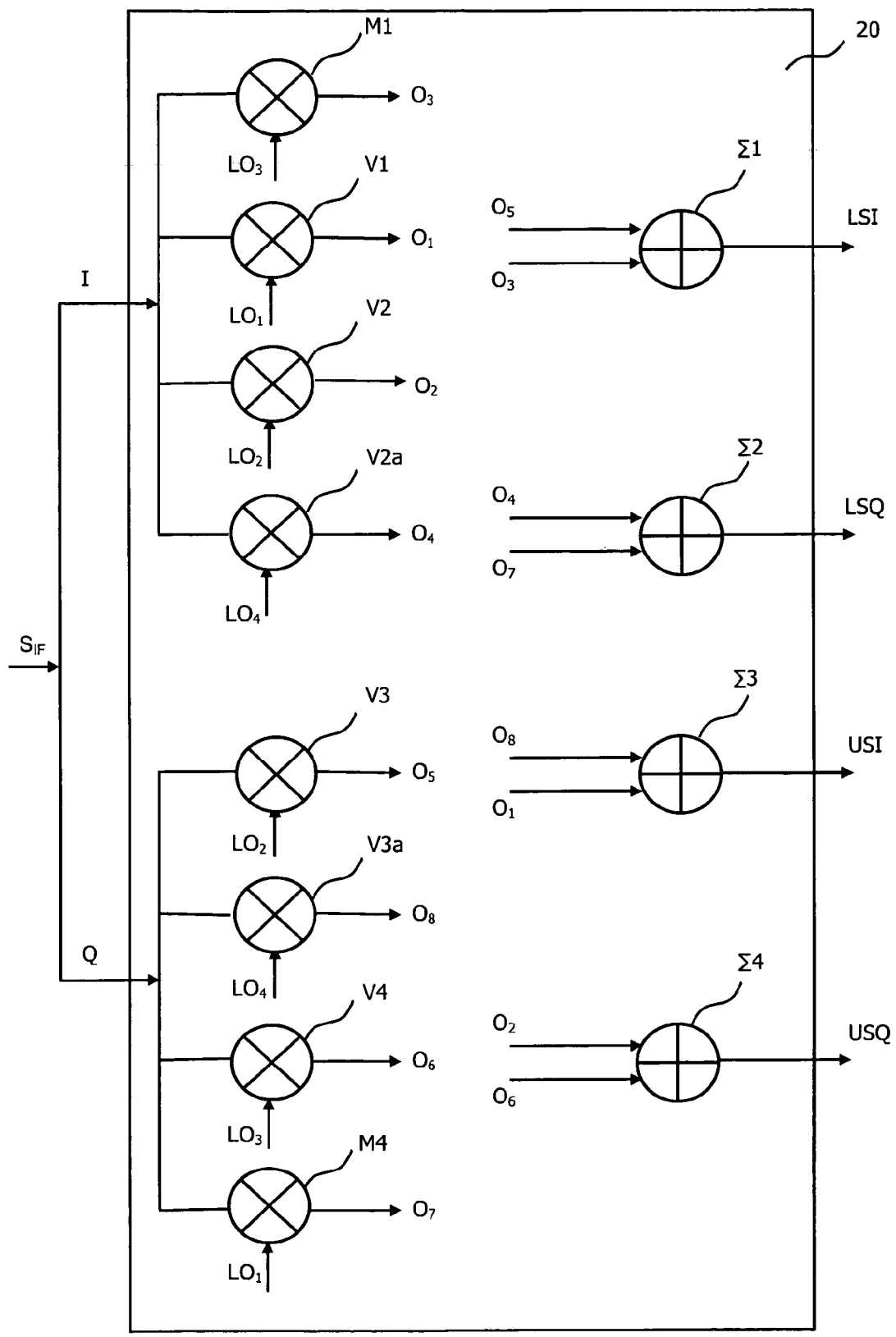
FIG. 6 is a block diagram showing yet another CIF mixer stage embodiment.

To this end, another CIF mixer stage embodying a symmetrical architecture is provided as shown in FIG. 6. This CIF mixer stage, denoted as 20, converts IF signals input to the stage to baseband frequency. The input scenario of the IF signals with respect to FIG. 6 is similar to that of FIG. 4: the IF signals comprise a first phase signal, I, and a second phase signal, Q, which are to be converted by the CIF mixer stage 20 to baseband frequency signals which comprise a lower side band signal and an upper side band signal. The CIF mixer stage 20 comprises a first branch and a second branch for receiving the first phase signal and the second phase signal, respectively. Each branch comprises four mixers configured to be driven by LO signals to convert the received first phase signal I or second phase signal Q to four output signals respectively.

Comparing FIG. 6 with FIG. 4, two more mixers are arranged in the CIF mixer stage. The first new mixer, denoted as V2a, is added into the first branch and configured to be driven by a new, fourth IF clock signal, LO$_4$, to convert the first phase signal I into an output signal O$_4$ (not the same O$_4$ as shown in FIG. 4). Analogously, the second new mixer, denoted as V3a, is added into the second branch and configured to be driven by the fourth IF clock signal, LO$_4$, into an output signal O$_8$. Due to the addition of mixers V2a and V3a, the "existing" mixers (existing in the second branch in the FIG. 4 scenario) V3, V4, and M4, are re-referenced as the "fifth", "sixth", and "seventh" mixers in the FIG. 6 scenario. The mixer V3a added onto the second branch is denoted as the "eighth" mixer. Accordingly, the output signals from the fifth, sixth, seventh, and eighth mixers are denoted as the fifth, sixth, seventh, and eighth signals, i.e., O$_5$, O$_6$, O$_7$, and O$_8$, respectively, as shown in FIG. 6.

As in FIG. 4, the CIF mixer stage 20 shown in FIG. 6 uses four adders $\Sigma 1$, $\Sigma 2$, $\Sigma 3$, and $\Sigma 4$. However, the signals to be combined by these adders are slightly different than the ones in the FIG. 4 implementation. Specifically for FIG. 6, the first adder $\Sigma 1$ combines the fifth and third output signals, O$_5$ and O$_3$, to form a first phase portion of the lower side band signal LSI; the second adder $\Sigma 2$ combines the fourth and seventh output signals, O$_4$ and O$_7$, to form a second phase portion of the lower side band signal LSQ; the third adder $\Sigma 3$ combines the eighth and first output signals, O$_8$ and O$_1$, to form a first phase portion of the upper side band signal USI; and the fourth adder $\Sigma 4$ combines the second and sixth output signals, O$_2$ and O$_6$, to form a second phase portion of the upper side band signal USQ.

The first, second, third and fourth IF clock signals driving the total eight mixers have a predefined phase relationship among them. According to one variant, the second IF clock signal and the fourth IF clock signal, $LO_2$ and $LO_4$, have the same phase; the first IF clock signal and the second IF clock signal, $LO_1$ and $LO_2$, have a phase difference of generally (nominally) 90 degrees and an additional phase skew ($\theta1$) with respect to each other; and the third IF clock signal and the second IF clock signal, $LO_3$ and $LO_2$, have a phase difference of generally (nominally) 90 degrees and another additional phase skew ($\theta2$) with respect to each other. According to another variant of the "predefined phase relationship", the third IF clock signal and the fourth IF clock signal, $LO_3$ and $LO_4$, have a phase difference of generally (nominally) 90 degrees with respect to each other; the first IF clock signal and the third IF clock signal, $LO_1$ and $LO_3$, have an additional phase skew ($\theta1$) with respect to each other; and the second IF clock signal and the fourth IF clock signal, $LO_2$ and $LO_4$, have another additional phase skew ($\theta2$, or from another perspective, 82) with respect to each other. The phase skews mentioned above may be tuneable. Of course, other variants can be implemented for the predefined phase relationship among the four IF clock signals.

The "abstract" architecture of the symmetrical CIF mixer stage 20 shown in FIG. 6 may be realized in many suitable implementations. An example of such an implementation is presented in FIG. 6A and another in FIG. 6B, where the layout of the eight individual mixers and the four adders as well as the signal flowing are analogous to those in FIG. 6.

Figure 6A:
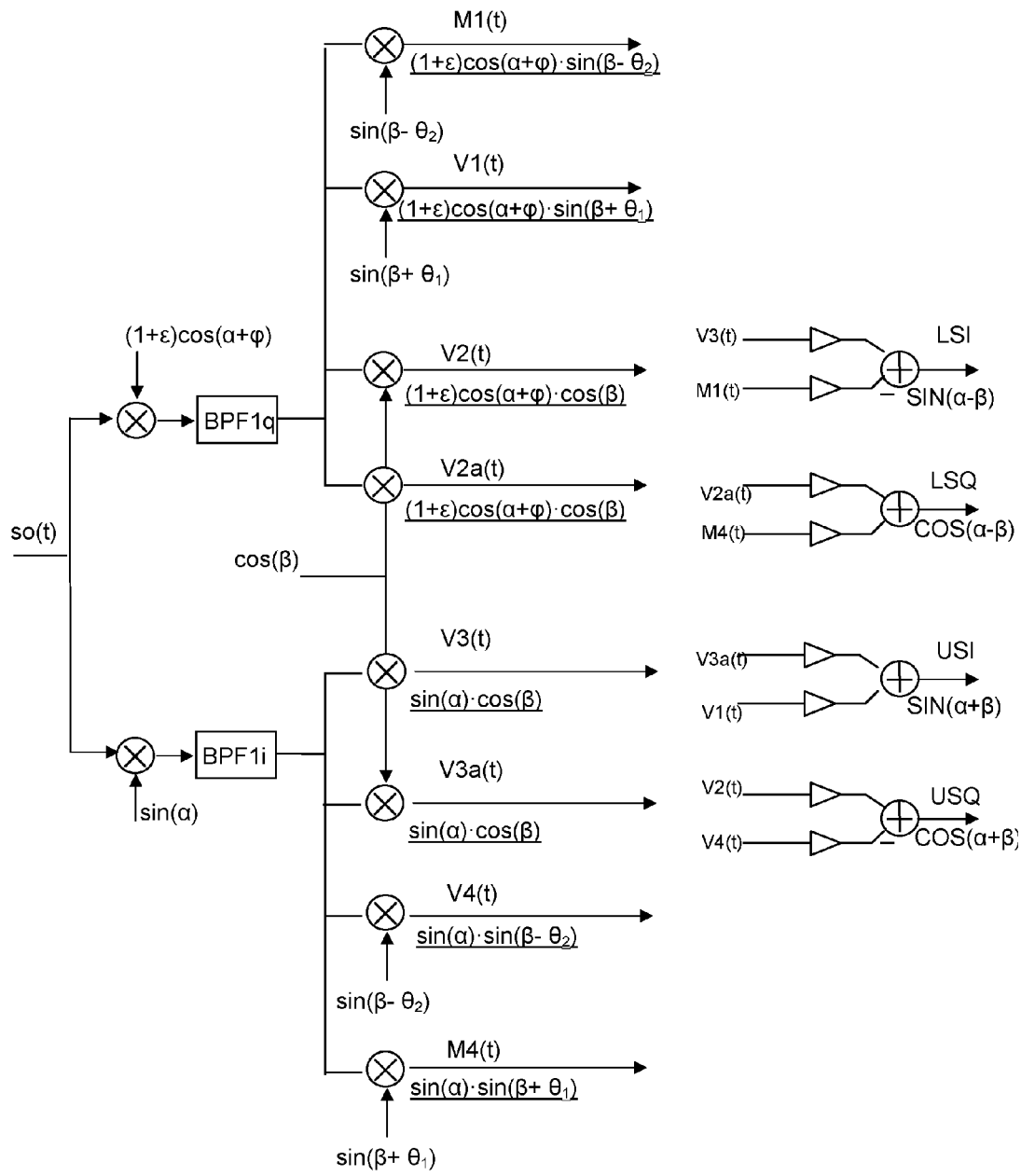
FIG. 6A is a block diagram showing a further CIF mixer stage embodiment.

With respect to the CIF mixer stage illustrated in FIG. 6A, the first, second, third, and fourth IF clock signals are $\sin(\beta+\theta_1)$, $\cos(\beta)$, $\sin(\beta-\theta_2)$, and $\cos(\beta)$, respectively. Hence, the "predefined phase relationship" among them conforms to the following: the second IF clock signal, $\cos(\beta)$, and the fourth IF clock signal, also $\cos(\beta)$, have the same phase; the first IF clock signal, $\sin(\beta+\theta_1)$, and the second IF clock signal, $\cos(\beta)$, have a phase difference of 90 degrees and an additional phase skew ($\theta_1$) with respect to each other; and the third IF clock signal, $\sin(\beta-\theta_2)$, and the second IF clock signal $\cos(\beta)$, have a phase difference of 90 degrees and another additional phase skew ($\theta_2$, or seen from another perspective, $-\theta_2$) with respect to each other.

Figure 6B:
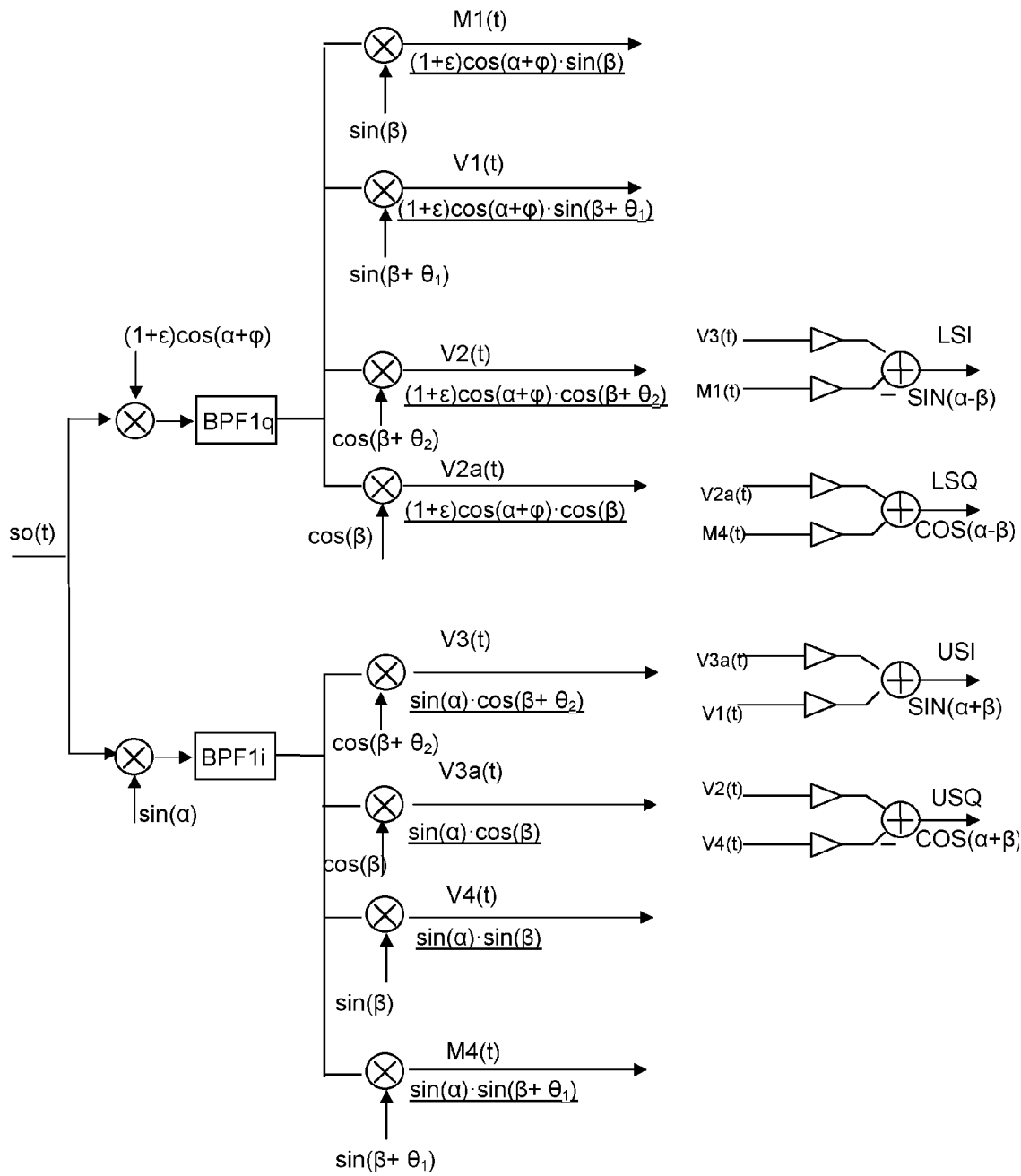
FIG. 6B is a block diagram showing yet a further CIF mixer stage embodiment.

Another variant of the "predefined phase relationship" among the IF clock signals is adopted by the exemplary CIF mixer stage shown in FIG. 6B. The CIF mixer stages in FIGS. 6A and 6B are identical except for the four IF clock signals used for driving the respective mixers. In the FIG. 6B implementation, the "first", "second", "third", and "fourth" IF clock signals referred to in FIG. 6A are substituted by the following: $\sin(\beta+\theta_1)$, $\cos(\beta+\theta_2)$, $\sin(\beta)$, and $\cos(\beta)$. Hence, the four IF clock signals in the FIG. 6B case conform to the following predefined phase relationship: the third IF clock signal, $\sin(\beta)$, and the fourth IF clock signal, $\cos(\beta)$, have a phase difference of generally (nominally) 90 degrees with respect to each other; the first IF clock signal, $\sin(\beta+\theta_1)$, and the third IF clock signal, $\sin(\beta)$, have an additional phase skew ($\theta_1$) with respect to each other; and the second IF clock signal, $\cos(\beta+\theta_2)$, and the fourth IF clock signal, $\cos(\beta)$, have another additional phase skew ($\theta_2$) with respect to each other. The additional phase skews $\theta_1$ and $\theta_2$ may be tuneable.

As mentioned above, in the case of a low frequency $f_{LO2}$, if the mixer conversion gains are calibrated and the $f_{LO2}$ phases are set as $\theta_1=\theta_2=\phi$, the image interference will be removed.

The in-band IQ leakage correction technique discussed above for FIG. 5 may also be incorporated in the CIF mixer stage of FIG. 6A or FIG. 6B so as to perform a further procedure, IQ leakage decoupling, as explained above.

Figure 7:
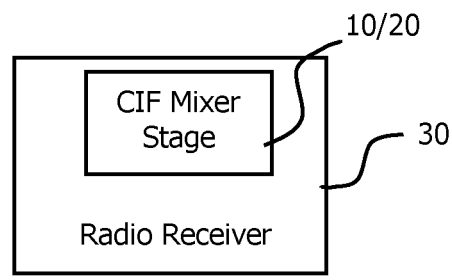
FIG. 7 is a block diagram showing a radio receiver comprising a CIF mixer stage embodiment.

FIG. 7 shows a radio receiver 30 incorporating any of the CIF mixer stages (such as 10 in FIGS. 4 and 4A or 20 in FIGS. 6, 6A, and 6B, or any of their variants) presented above. The CIF mixer stage, e.g., 10 or 20, may be integrated within a dual-carrier radio receiver and adapted to operate in a full mode. Alternatively, the CIF mixer stage 10 or 20 may be integrated within a single-carrier radio receiver and adapted to operate in an half mode.

3. Calibration of Mixer Conversion Gain

For all the implementations of the CIF mixer stage given above, further means may be incorporated therein to better control the calibration of the conversion gains of the mixer paths. To this end, several improvements can be made. Firstly, at least one of the mixers comprised in the CIF mixer stage may be designed to further comprise a control unit for enabling or disabling the mixer. Secondly, gain calibration for at least one of the mixers in the CIF mixer stage may be replaced by a plurality of mixing units, or small mixers, arranged in parallel in the mixer stage, wherein each mixing unit comprises an enable/disable control unit. Thirdly, gain calibration for at least one of the mixers in the CIF mixer stage may be achieved by changing a power supply of the clock driver of the respective IF clock signal and/or changing the clock swing of the respective IF clock signal. Other improvements are also possible. For further gain calibration for a mixer, a second control unit (Gcal) may be incorporated in the CIF mixing stage for (fine) tuning of the conversion gain of the mixer.

Figure 8:
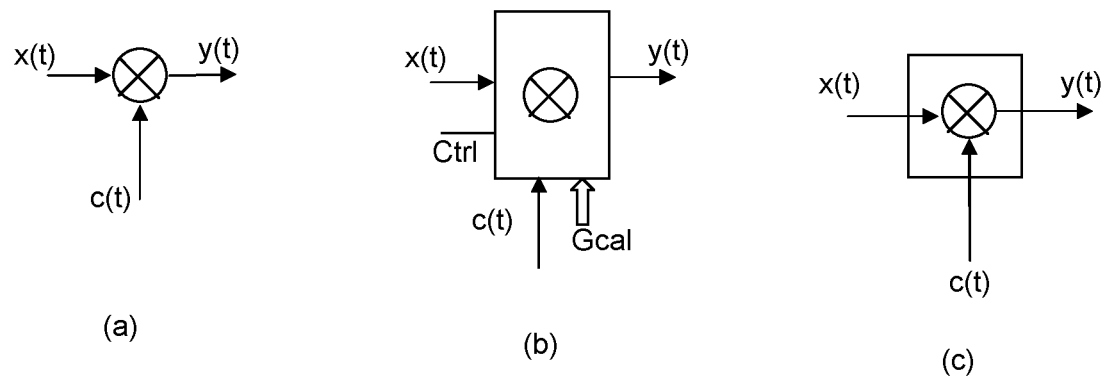
FIG. 8 illustrates three block diagram (a), (b), and (c) showing a tuneable mixer.

The gain conversion improvements mentioned above can be better understood by referring to FIGS. 8(a), (b), and (c). As illustrated in these figures, a tuneable, or programmable, mixer may be employed to replace the basic mixer circuitry. The basic mixer symbol and the tuneable mixer symbol are respectively shown in FIGS. 8(a) and (b). FIG. 8(c) shows a simplified symbol for the tuneable mixer. Besides signal input x(t) and clock input c(t), the tuneable mixer has additional control inputs Ctrl and Gcal. Ctrl is used for selecting the mixer working mode, and Gcal is for the fine tuning. Ctrl and Gcal may be vectors, respectively.

The conversion gain of a tuneable mixer is tuneable, for example, according to a control word c(t). There are many ways to calibrate the conversion gain of a mixer. For example, by changing the clock driver power supply and/or changing the clock swing. Another way is to use a mixer core including a plurality of small mixers, or mixer units, in parallel with enable/disable control inputs, hence the effective width of the mixer core is tuneable, leading to different conversion gains. The sizes, or the conversion gains, of the plurality of mixer units may be the same or different.

One implementation of the tuneable mixer can provide the following exemplary functions indicated in the table below:

TABLE 1

| Ctrl | y(t) | Mode |
|---|---|---|
| 0 | 0 | Disabled |
| 1 | $x(t)(1 + g_c)$ | Pass |
| 2 | $x(t)c(t)(1 + g_c)$ | Enabled |

According to Table 1, when Ctrl is set to 0, the tuneable mixer provides no output. "No output" means no contribution for the next stage. (In current mode, it does not have output current, and in voltage mode it does not have output voltage, and so on.) When Ctrl is set to 1, the mixer does not execute the mixing function but only passes the input x(t) to the output. Only when the mixer is set to 2, the programmable mixer performs the mixing function to create the product of input x(t) and clock c(t) at its output.

Through the vector Gcal, the gain of the tuneable mixer can be finely tuned so that the normalized gain becomes $1+g_c$, where $g_c$ is proportional to the vector Gcal and is within a range $[-\epsilon, \epsilon]$, where $\epsilon$ is a small real number greater than zero.

4. Tuneable Phase Skew Unit

As a further improvement, means for phase calibration may be provided in any of the CIF mixer stages discussed above for calibrating the phase of at least one of the IF clock signals. Among numerous possible implementations, a phase skew unit comprising at least one delay clock buffer may be used as the phase calibrator. Phase calibration of at least one of the IF clock signals may be achieved by adjusting the supply voltage of the clock buffer.

As exemplary, a tuneable phase skew unit can be implemented by inserting tuneable RC networks between two inverters of buffers. The tuneable RC networks can be designed with a switched capacitor array, or a switched resistor array, or their combinations. It can also be implemented with active devices like MOS transistors, by changing the supply voltage or conducting current, etc.

For example, two quadrature phases, e.g., $\cos(\beta)$ and $\sin(\beta)$, at IF frequency can be generated by a divide-by-2 circuitry. Tuneable delay clock buffers can be used to generate the required clock phases $\cos(\beta+c0)$, $\sin(\beta+c0-\theta_1)$ and $\sin(\beta+c0+\theta_2)$ by adjusting the different supply voltages of the clock buffers, say at voltages v0, $v0+\Delta v_1$, and $v0-\Delta v_2$, respectively. Here c0 is a normal phase skew at supply voltage v0. Therefore different phase skews can be generated. As the RF phase mismatch is relative small, the method is fully feasible.

Another example to generate quadrature phases with required phase skews is to use linear combination, such as:

$$\cos(\beta + c0) \Leftarrow \cos(\beta) \qquad (14)$$

$$\sin(\beta + c0 + \theta_1) \Leftarrow \frac{a_1}{\sqrt{a_1^2 + b_1^2}}\sin(\beta) + \frac{b_1}{\sqrt{a_1^2 + b_1^2}}\cos(\beta)$$

$$\sin(\beta + c0 - \theta_2) \Leftarrow \frac{a_2}{\sqrt{a_2^2 + b_2^2}}\sin(\beta) - \frac{b_2}{\sqrt{a_2^2 + b_2^2}}\cos(\beta)$$

Still, there are many other ways to implement the required clock skew.

5. Operation of the CIF Mixer Stage

Referring to FIGS. 9 and 10, exemplary methods for operating the CIF mixer stage of the present invention are provided. The method 100 presented in FIG. 9 corresponds to the CIF mixer stage 10 according to FIGS. 4 and 4A as well as any of their variants. Method 100 can be divided into two basic steps, a "mixing" step, denoted as 110, where the individual mixers of the CIF mixing stage 10 are driven by IF clock signals to convert the received IF signals to respective output signals, and a "combining" step 120, in which the output signals from the mixers are combined in a proper way to form the desired lower and upper side band signals.

As shown in FIG. 9 specifically, the mixing step 110 comprises the following substeps: providing the first phase signal I of the IF signals $S_{IF}$ to the mixers (10) of the first branch and the second phase signal Q of the IF signals $S_{IF}$ to the mixers of the second branch; providing a first IF clock signal to the first mixer (V1) to convert the first phase signal received at the first mixer (V1) to a first output signal; providing a second IF clock signal to the second mixer (V2) to convert the first phase signal received at the second mixer (V2) to a second output signal; providing a third IF clock signal to the third mixer (M1) to convert the first phase signal received at the third mixer (M1) to a third output signal; providing the second IF clock signal to the fourth mixer (V3) to convert the second phase signal received at the fourth mixer (V3) to a fourth output signal; providing the third IF clock signal to the fifth mixer (V4) to convert the second phase signal received at the fifth mixer (V4) to a fifth output signal; and providing the first IF clock signal to the sixth mixer (M4) to convert the second phase signal received at the sixth mixer (M4) to a sixth output signal; wherein the first, the second, and the third IF clock signals have a predefined phase relationship with respect to each other.

The combining step 120 comprises the following substeps: combining the fourth and third output signals to form a first phase portion of the lower side band signal (LSI); combining the second and sixth output signals to form a second phase portion of the lower side band signal (LSQ); combining the fourth and first output signals to form a first phase portion of the upper side band signal (USI); and combining the second and fifth output signals to form a second phase portion of the upper side band signal (USQ). Analogous to FIG. 9, FIG. 10 illustrates a method 200 of operating the CIF mixer stage 20 according to any one of FIGS. 6, 6A, 6B, and any of their variants. Method 200 can be viewed as involving two basic steps, a "mixing" step 210 and a "combining" step 220. Specifically, the mixing step 210 comprises the following substeps: providing the first phase signal of the IF signals to the mixers (20) of the first branch and the second phase signal of the IF signals to the mixers of the second branch; providing a first IF clock signal to the first mixer (V1) to convert the first phase signal received at the first mixer (V1) to a first output signal; providing a second IF clock signal to the second mixer (V2) to convert the first phase signal received at the second mixer (V2) to a second output signal; providing a third IF clock signal to the third mixer (M1) to convert the first phase signal received at the third mixer (M1) to a third output signal; providing a fourth IF clock signal to the fourth mixer (V2a) to convert the first phase signal received at the fourth mixer (V2a) to a fourth output signal; providing the second IF clock signal to the fifth mixer (V3) to convert the second phase signal received at the fifth mixer (V3) to a fifth output signal; providing the third IF clock signal to the sixth mixer (V4) to convert the second phase signal received at the sixth mixer (V4) to a sixth output signal; providing the first IF clock signal to the seventh mixer (M4) to convert the second phase signal received at the seventh mixer (M4) to a seventh output signal; and providing the fourth IF clock signal to the eighth mixer (V3a) to convert the second phase signal received at the eighth mixer (V3a) to an eighth output signal; wherein the first, the second, the third, and the fourth IF clock signals have a predefined phase relationship with respect to each other.

And the combining step 220 comprises the following substeps: combining the fifth and third output signals to form a first phase portion of the lower side band signal (LSI); combining the fourth and seventh output signals to form a second phase portion of the lower side band signal (LSQ); combining the eighth and first output signals to form a first phase portion of the upper side band signal (USI); and combining the second and sixth output signals to form a second phase portion of the upper side band signal (USQ).

IQ leakage control may be included in the above methods as a further improvement as discussed above with respect to FIG. 5. Accordingly, each method above may further comprise a step of removing, from the first phase portion of the lower side band signal, the IQ leakage caused by the second phase portion of the lower side band signal and/or a step of removing, from the first phase portion of the upper side band signal, the IQ leakage caused by the second phase portion of the upper side band signal.

6. Calibration Method

Figure 11:
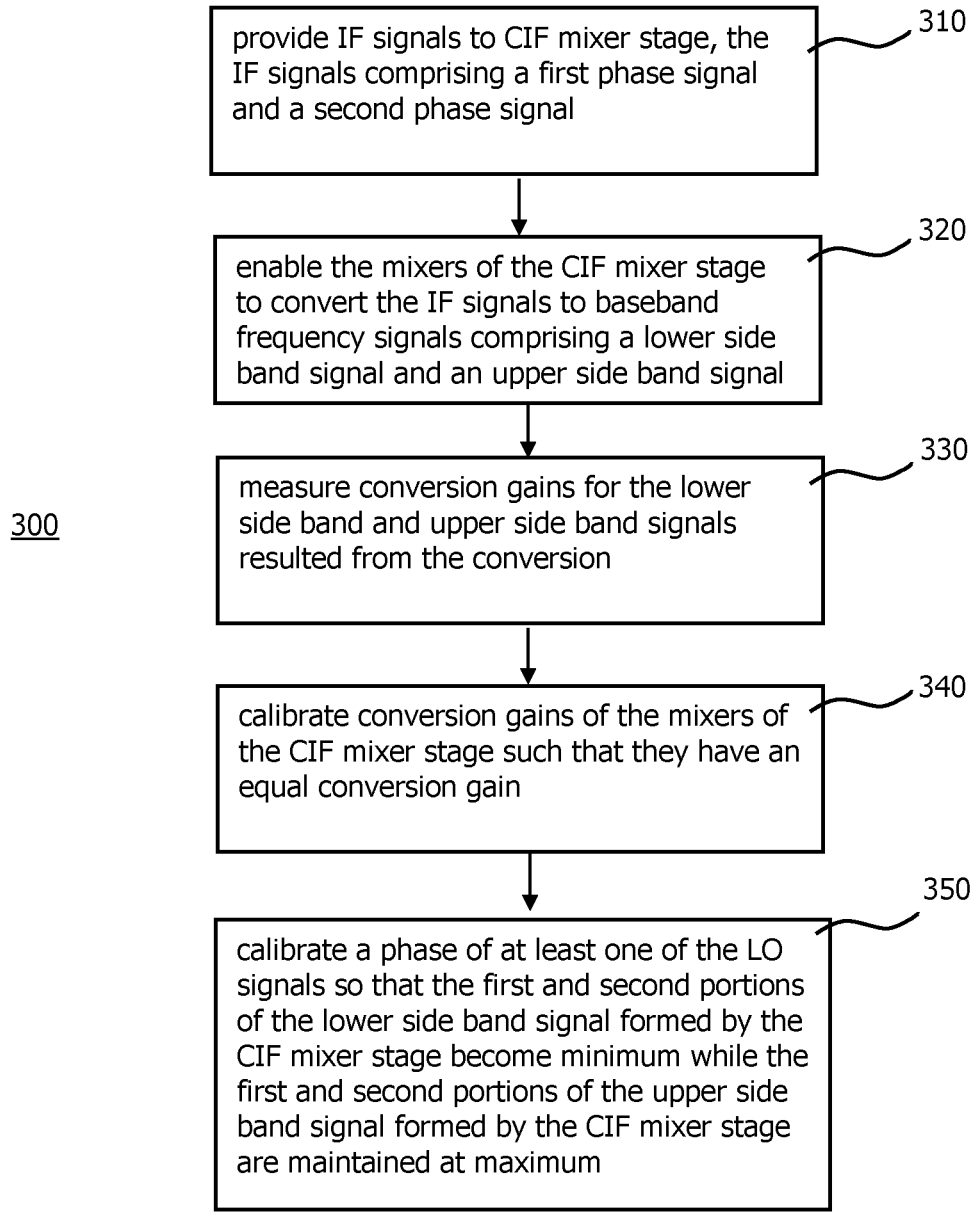
FIG. 11 is a flow diagram showing a calibration method for a CIF mixer stage embodiment.

FIG. 11 shows an exemplary method of calibrating a CIF mixer stage according to any of the implementations presented above. The calibration method is denoted as 300 and it comprises the following major steps: initially, at step 310, IF signals are provided to the CIF mixer stage, the IF signals comprising a first phase signal and a second phase signal; then, at step 320, the mixers of the CIF mixer stage are enabled so as to convert the IF signals received thereat to baseband frequency signals which comprise a lower side band signal and an upper side band signal (the specific conversion details can be implemented according to the methods illustrated in FIGS. 9 and 10, for example); next, at step 330, differential gain for the lower side band and upper side band signals resulted from the conversion are determined; thereafter, at step 340, the conversion gains of the mixers are calibrated such that they have an equal conversion gain; and finally, at step 350, phase calibration is carried out; the phase of at least one of the IF clock signals is calibrated so that the first and second portions of the lower side band signal become minimum while the first and second portions of the upper side band signal are maintained at maximum.

Figure 11A:
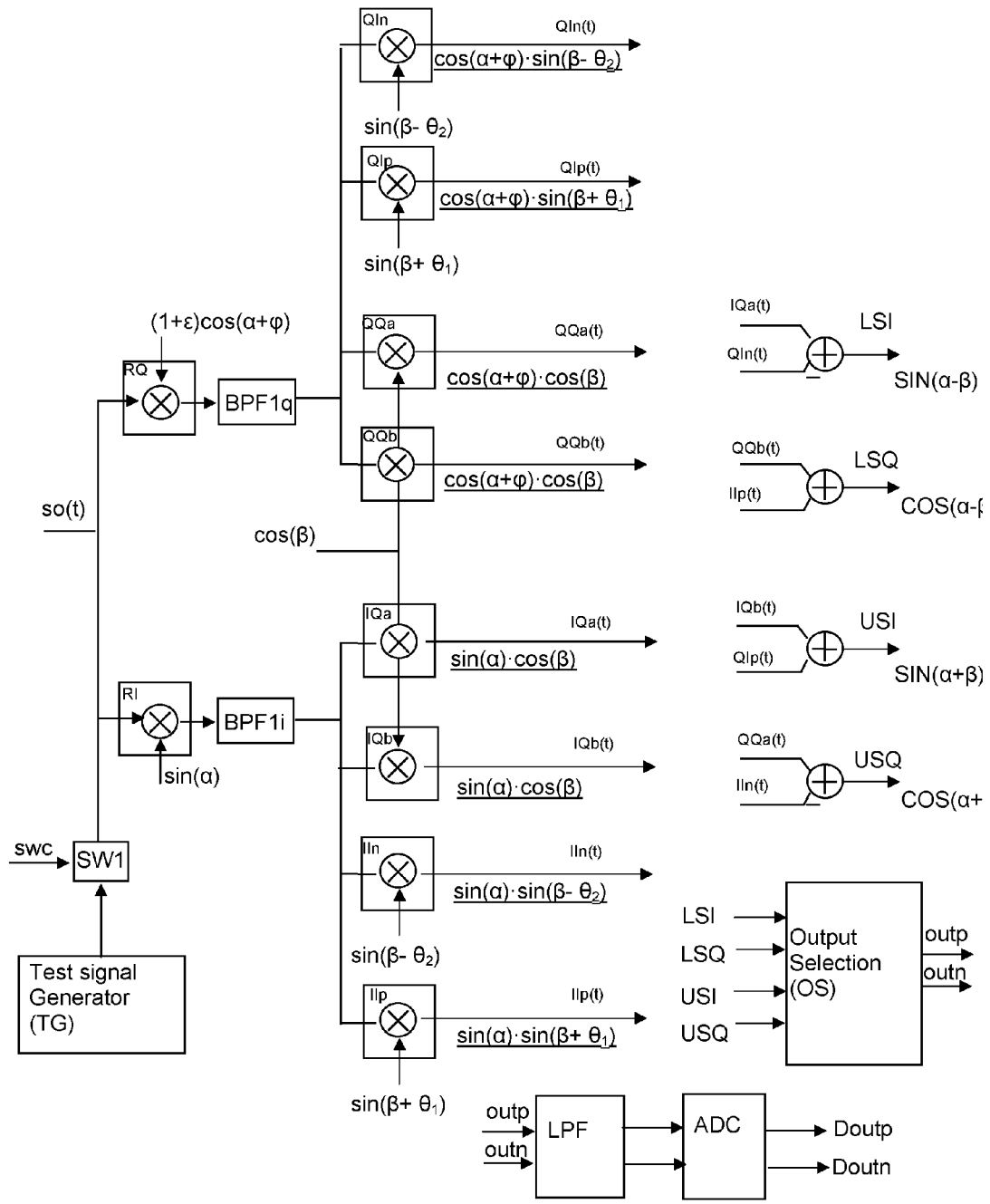
FIG. 11A is a block diagram showing another calibration method embodiment.

Another example of the calibration of the CIF mixer stage can be seen in FIG. 11A. A test signal generated by a test signal generator (TG) is inserted at the input RF node via a switch SW1 controlled by a logic signal denoted as swc. The outputs of the mixers are selected by the output selection switch matrix OS, filtered by the LPF, and quantized by the ADC, and finally reach the outputs of the ADC in a digital domain. TG function can be implemented via the transmitter in a transceiver, or by some hardware like an IQ modulator.

Calibration can be performed in many ways. An example for the upper side band calibration can be done in following steps:

Step 0: Initialization of Calibration

Inject an RF signal, e.g., a single tone RF test signal, at a frequency $f_{in}=f_{LO1} \pm f_{LO2}+\Delta f$, where $$f_{LO1} = \frac{\alpha}{2\pi}, f_{LO2} = \frac{\beta}{2\pi},$$

and $\Delta f$ is an offset frequency, respectively.

Enable all the mixers. Define, or predefine a goal for image interference leakage threshold Lr.

Step 1: Gain Calibration

Determine, e.g., by measuring the conversion gains for the upper side band and lower side band signals using the output selection switch matrix OS. For example detect either the peak amplitude or the averaged power of the outputs, and calibrate the mixers or the clock drivers, and configure them to have an equal path gain, e.g., by adjusting gain calibration signals Gcal for each mixer.

Step 2: Phase Calibration

Tune the phase skews $\theta_1$ and $\theta_2$ or the time delay in the secondary LO clocks, so that the outputs of LSI and LSQ become minimum while the outputs of USI and USQ are kept at a maximum.

Step 3: Checking of Calibration Result

Check if amplitudes of the LSI and LSQ outputs become less than Lr. If yes, go to Step 4, otherwise go to Step 1.

Step 4: In-Channel IQ Leakage Calibration

Determine, e.g., by measuring the phase skews $\theta_1$ and $\theta_2$, estimate $\phi$, and create matrix B+ and B– using Equation (10). Stop 7. Harmonic Rejection Test The calibration method mentioned about can be used for removing image interference in a dual carrier receiver, and it can also be used to test mixer harmonic rejection performance. For instance, by setting $\Delta f=\pm n \cdot f_{LO2}$, the same architecture shown in FIG. 11A can be used to detect harmonic rejection performance of the mixers. This provides a means to potentially reduce the harmonic mixing by tuning mixer parameters.

8. Technical Advantages

The various CIF mixer stage techniques presented above feature numerous technical advantages including but not limited to the following: Calibration can be facilitated at lower frequencies (at baseband frequency or a harmonic of IF frequency $f_{LO2}$ instead of at RF frequency), thus the implementation is easy. Moreover, calibration can be highly accurate as the injected test signal amplitude can be large enough to reduce measurement errors, and the test signal is more stable than any random data pattern and it is easy to be detected.

Calibration can be primarily performed in the analogue domain, so strong block signals can be cancelled at the output nodes of CIF. Compared with pure digital solutions, the analogue approach can handle large amplitude blocking signals. Moreover, compared with pure digital calibration methods, the calibrating method presented herein relaxes the design requirement for linearity, because the blocking or interference signals are filtered out earlier; whereas in pure digital calibration method, the blocking or interference signals will come along with the chain until they are removed, which means higher linearity requirement for components like LPF, ADC, etc.

The calibration technique presented herein may consume less power than digital cancellation methods as no extra power is needed after calibration. Additionally, the CIF mixer stage techniques presented above correct for gain and phase imbalances present in RF as well as IF mixers.

Although embodiments of the CIF mixer stages and the related methods have been illustrated in the accompanying drawings and described in the foregoing description, it will be understood that the invention is not limited to the embodiments disclosed herein. The CIF mixer stages and methods are capable of numerous rearrangements, modifications and substitutions without departing from the scope of the invention.

The invention claimed is:

1. A complex intermediate frequency (CIF) mixer stage for converting intermediate frequency (IF) signals to baseband frequency signals, the IF signals comprising a first phase signal and a second phase signal, the baseband frequency signals comprising a lower side band signal and an upper side band signal, the CIF mixer stage comprising:
   a first branch for receiving the first phase signal and comprising:
   a first mixer configured to be driven by a first IF clock signal to convert the first phase signal to a first output signal;
   a second mixer configured to be driven by a second IF clock signal to convert the first phase signal to a second output signal;
   a third mixer configured to be driven by a third IF clock signal to convert the first phase signal to a third output signal;

a second branch for receiving the second phase signal and comprising:
  a fourth mixer configured to be driven by the second IF clock signal to convert the second phase signal to a fourth output signal;
  a fifth mixer configured to be driven by the third IF clock signal to convert the second phase signal to a fifth output signal;
  a sixth mixer configured to be driven by the first IF clock signal to convert the second phase signal to a sixth output signal;
a first adder for combining the fourth and third output signals to form a first phase portion of the lower side band signal;
a second adder for combining the second and sixth output signals to form a second phase portion of the lower side band signal;
a third adder for combining the fourth and first output signals to form a first phase portion of the upper side band signal;
a fourth adder for combining the second and fifth output signals to form a second phase portion of the upper side band signal;
wherein the first, second, and third IF clock signals have a predefined phase relationship with respect to each other.

2. The CIF mixer stage of claim 1:
wherein the first IF clock signal and the second IF clock signal have a phase difference of generally 90 degrees and a first additional tuneable phase skew with respect to each other; and
the third IF clock signal and the second IF clock signal have a phase difference of generally 90 degrees and a second additional tuneable phase skew with respect to each other.

3. The CIF mixer stage of claim 1, wherein at least one of the mixers comprises a first control unit for enabling/disabling the mixer to mix the IF signals received at the mixer with the respective IF clock signal.

4. The CIF mixer stage of claim 3, wherein the at least one of the mixers comprises a second control unit for tuning a conversion gain of the mixer.

5. The CIF mixer stage of claim 1, further comprising a gain calibrator for calibrating a conversion gain of at least one of the mixers.

6. The CIF mixer stage of claim 5, wherein the gain calibrator comprises a plurality of mixing units arranged in the mixer in parallel, each mixing unit comprising an enable/disable control unit.

7. The CIF mixer stage of claim 5, wherein the gain calibrator is configured to change a power supply of a clock driver of the respective IF clock signal and/or to change a clock swing of the respective IF clock signal.

8. The CIF mixer stage of claim 1, further comprising a phase skew unit configured to calibrate the phase of at least one of the IF clock signals.

9. The CIF mixer stage of claim 8, wherein the phase skew unit comprises at least one delay clock buffer adapted to calibrate the phase of at least one of the IF clock signals by adjusting a supply voltage of the clock buffer.

10. The CIF mixer stage of claim 1, further comprising an IQ leakage correction unit configured to perform at least one of the following:
  remove, from the first phase portion of the lower side band signal, IQ leakage caused by the second phase portion of the lower side band signal;
  remove, from the first phase portion of the upper side band signal, IQ leakage caused by the second phase portion of the upper side band signal.

11. A complex intermediate frequency, (CIF) mixer stage for converting intermediate frequency (IF) signals to baseband frequency signals, the IF signals comprising a first phase signal and a second phase signal, the baseband frequency signals comprising a lower side band signal and an upper side band signal, the CIF mixer stage comprising:
a first branch for receiving the first phase signal and comprising:
  a first mixer configured to be driven by a first IF clock signal to convert the first phase signal to a first output signal;
  a second mixer configured to be driven by a second IF clock signal to convert the first phase signal to a second output signal;
  a third mixer configured to be driven by a third IF clock signal to convert the first phase signal to a third output signal;
  a fourth mixer configured to be driven by a fourth IF clock signal to convert the first phase signal to a fourth output signal;
a second branch for receiving the second phase signal and comprising:
  a fifth mixer configured to be driven by the second IF clock signal to convert the second phase signal to a fifth output signal;
  a sixth mixer configured to be driven by the third IF clock signal to convert the second phase signal to a sixth output signal;
  a seventh mixer configured to be driven by the first IF clock signal to convert the second phase signal to a seventh output signal;
  an eighth mixer configured to be driven by the fourth IF clock signal to convert the second phase signal to an eighth output signal;
a first adder for combining the fifth and third output signals to form a first phase portion of the lower side band signal;
a second adder for combining the fourth and seventh output signals to form a second phase portion of the lower side band signal;
a third adder for combining the eighth and first output signals to form a first phase portion of the upper side band signal;
a fourth adder for combining the second and sixth output signals to form a second phase portion of the upper side band signal;
wherein the first, second, third, and fourth IF clock signals have a predefined phase relationship with respect to each other.

12. The CIF mixer stage of claim 11, wherein:
the second IF clock signal and the fourth IF clock signal have the same phase;
the first IF clock signal and the second IF clock signal have a phase difference of generally 90 degrees and a first additional tuneable phase skew with respect to each other;
the third IF clock signal and the second IF clock signal have a phase difference of generally 90 degrees and a second additional tuneable phase skew with respect to each other.

13. The CIF mixer stage of claim 11, wherein:
the third IF clock signal and the fourth IF clock signal have a phase difference of generally 90 degrees with respect to each other;

the first IF clock signal and the third IF clock signal have a first additional tuneable phase skew with respect to each other;

the second IF clock signal and the fourth IF clock signal have a second additional tuneable phase skew with respect to each other.

14. A radio receiver comprising:
a complex intermediate frequency (CIF) mixer stage for converting intermediate frequency (IF) signals to baseband frequency signals, the IF signals comprising a first phase signal and a second phase signal, the baseband frequency signals comprising a lower side band signal and an upper side band signal;
wherein the CIF mixer stage comprises:
  a first branch for receiving the first phase signal and comprising:
    a first mixer configured to be driven by a first IF clock signal to convert the first phase signal to a first output signal;
    a second mixer configured to be driven by a second IF clock signal to convert the first phase signal to a second output signal;
    a third mixer configured to be driven by a third IF clock signal to convert the first phase signal to a third output signal;
  a second branch for receiving the second phase signal and comprising:
    a fourth mixer configured to be driven by the second IF clock signal to convert the second phase signal to a fourth output signal;
    a fifth mixer configured to be driven by the third IF clock signal to convert the second phase signal to a fifth output signal;
    a sixth mixer configured to be driven by the first IF clock signal to convert the second phase signal to a sixth output signal;
  a first adder for combining the fourth and third output signals to form a first phase portion of the lower side band signal;
  a second adder for combining the second and sixth output signals to form a second phase portion of the lower side band signal;
  a third adder for combining the fourth and first output signals to form a first phase portion of the upper side band signal;
  a fourth adder for combining the second and fifth output signals to form a second phase portion of the upper side band signal;
  wherein the first, second, and third IF clock signals have a predefined phase relationship with respect to each other.

15. A method for operating a complex intermediate frequency (CIF) mixer stage to convert intermediate frequency (IF) signals to baseband frequency signals, the IF signals comprising a first phase signal and a second phase signal, the baseband frequency signals comprising a lower side band signal and an upper side band signal, the CIF mixer stage comprising a first branch and a second branch, the first branch comprising first, second, and third mixers, the second branch comprising fourth, fifth, and sixth mixers, the method comprising:
providing the first phase signal of the IF signals to the mixers of the first branch;
providing the second phase signal of the IF signals to the mixers of the second branch;

providing a first IF clock signal to the first mixer to convert the first phase signal received at the first mixer to a first output signal;
providing a second IF clock signal to the second mixer to convert the first phase signal received at the second mixer to a second output signal;
providing a third IF clock signal to the third mixer to convert the first phase signal received at the third mixer to a third output signal;
providing the second IF clock signal to the fourth mixer to convert the second phase signal received at the fourth mixer to a fourth output signal;
providing the third IF clock signal to the fifth mixer to convert the second phase signal received at the fifth mixer to a fifth output signal;
providing the first IF clock signal to the sixth mixer to convert the second phase signal received at the sixth mixer to a sixth output signal;
combining the fourth and third output signals to form a first phase portion of the lower side band signal;
combining the second and sixth output signals to form a second phase portion of the lower side band signal;
combining the fourth and first output signals to form a first phase portion of the upper side band signal; and
combining the second and fifth output signals to form a second phase portion of the upper side band signal;
wherein the first, the second, and the third IF clock signals have a predefined phase relationship with respect to each other.

16. The method of claim 15, wherein:
the first IF clock signal and the second IF clock signal have a phase difference of generally 90 degrees and a first additional tuneable phase skew with respect to each other;
the third IF clock signal and the second IF clock signal have a phase difference of generally 90 degrees and a second additional tuneable phase skew with respect to each other.

17. The method of claim 15, further comprising:
removing, from the first phase portion of the lower side band signal, IQ leakage caused by the second phase portion of the lower side band signal; and/or
removing, from the first phase portion of the upper side band signal, IQ leakage caused by the second phase portion of the upper side band signal.

18. A method for operating a complex intermediate frequency (CIF) mixer stage to convert intermediate frequency (IF) signals to baseband frequency signals, the IF signals comprising a first phase signal and a second phase signal, the baseband frequency signals comprising a lower side band signal and an upper side band signal, the CIF mixer stage comprising a first branch and a second branch, the first branch comprising first, second, third, and fourth mixers; the second branch comprising fifth, sixth, seventh, and eighth mixers, the method comprising:
providing the first phase signal of the IF signals to the mixers of the first branch;
providing the second phase signal of the IF signals to the mixers of the second branch;
providing a first IF clock signal to the first mixer to convert the first phase signal received at the first mixer to a first output signal; providing a second IF clock signal to the second mixer to convert the first phase signal received at the second mixer to a second output signal;
providing a third IF clock signal to the third mixer to convert the first phase signal received at the third mixer to a third output signal; providing a fourth IF clock signal to the fourth mixer to convert the first phase signal received at the fourth mixer to a fourth output signal;

providing the second IF clock signal to the fifth mixer to convert the second phase signal received at the fifth mixer to a fifth output signal;

providing the third IF clock signal to the sixth mixer to convert the second phase signal received at the sixth mixer to a sixth output signal;

providing the first IF clock signal to the seventh mixer to convert the second phase signal received at the seventh mixer to a seventh output signal;

providing the fourth IF clock signal to the eighth mixer to convert the second phase signal received at the eighth mixer to an eighth output signal;

combining the fifth and third output signals to form a first phase portion of the lower side band signal;

combining the fourth and seventh output signals to form a second phase portion of the lower side band signal;

combining the eighth and first output signals to form a first phase portion of the upper side band signal; and combining the second and sixth output signals to form a second phase portion of the upper side band signal;

wherein the first, second, third, and fourth IF clock signals have a predefined phase relationship with respect to each other.

19. The method of claim 18, wherein:

the second IF clock signal and the fourth IF clock signal have the same phase;

the first IF clock signal and the second IF clock signal have a phase difference of generally 90 degrees and a first additional tuneable phase skew with respect to each other;

the third IF clock signal and the second IF clock signal have a phase difference of generally 90 degrees and a second additional tuneable phase skew with respect to each other.

20. The method of claim 18, wherein:

the third IF clock signal and the fourth IF clock signal have a phase difference of generally 90 degrees;

the first IF clock signal and the third IF clock signal have a first additional tuneable phase skew with respect to each other; and the second IF clock signal and the fourth IF clock signal have a second additional tuneable phase skew with respect to each other.

21. The method of claim 18, further comprising:

removing, from the first phase portion of the lower side band signal, IQ leakage caused by the second phase portion of the lower side band signal; and/or removing, from the first phase portion of the upper side band signal, IQ leakage caused by the second phase portion of the upper side band signal.

22. A method of calibrating a complex intermediate frequency (CIF) mixer stage comprising:

providing intermediate frequency (IF) signals to the CIF mixer stage, the IF signals comprising a first phase signal and a second phase signal;

enabling mixers of the CIF mixer stage to convert the IF signals to baseband frequency signals comprising a lower side band signal and an upper side band signal;

measuring conversion gains for the lower side band and upper side band signals resulted from the conversion;

calibrating conversion gains of the mixers of the CIF mixer stage such that they have an equal conversion gain;

calibrating a phase of at least one IF clock signals so that first and second portions of the lower side band signal formed by the CIF mixer stage become minimum while first and second portions of the upper side band signal formed by the CIF mixer stage are maintained at maximum.

23. The method of claim 22, wherein the calibrating the phase of the at least one IF clock signal comprises calibrating tuneable phase skews between the IF clock signals.

24. The method of claim 22, further comprising:

determining if amplitudes of the first and second portions of the lower side band signal are less than a predefined leakage threshold;

in response to it being determined that the amplitudes of the first and second portions of the lower side band signal are less than the predefined leakage threshold, repeating:
the calibrating conversion gains of the mixers;
the calibrating the phase of the at least one IF clock signals;

in response to it being determined that the amplitudes of the first and second portions of the lower side band signal are not less than the predefined leakage threshold, performing at least one of the following:
removing, from the first phase portion of the lower side band signal, IQ leakage caused by the second phase portion of the lower side band signal;
removing, from the first phase portion of the upper side band signal, IQ leakage caused by the second phase portion of the upper side band signal.

25. The method of claim 24, wherein removing the IQ leakage caused by the second phase portion of the lower side band signal comprises:

determining a phase difference between the first and second phase portions of the lower side band signal;

creating an IQ leakage decoupling matrix based on the determined phase difference;

applying the IQ leakage decoupling matrix to the first phase portion of the lower side band signal to remove the IQ leakage caused by the second phase portion of the lower side band signal.

26. The method of claim 24, wherein removing the IQ leakage caused by the second phase portion of the upper side band signal comprises:

determining a phase difference between the first and second phase portions of the upper side band signal;

creating an IQ leakage decoupling matrix based on the determined phase difference; and applying the IQ leakage decoupling matrix to the first phase portion of the upper side band signal to remove the IQ leakage caused by the second phase portion of the upper side band signal.

* * * * *

UNITED STATES PATENT AND TRADEMARK OFFICE
CERTIFICATE OF CORRECTION

PATENT NO. : 8,768,283 B2  Page 1 of 1
APPLICATION NO. : 13/823785
DATED : July 1, 2014
INVENTOR(S) : Mu et al.

It is certified that error appears in the above-identified patent and that said Letters Patent is hereby corrected as shown below:

In the Specification

In Column 5, Line 31, delete "correaction" and insert -- correction --, therefor.

In Column 12, Line 24, delete "Ito" and insert -- I to --, therefor.

In Column 13, Line 3, delete "skews." and insert -- skews --, therefor.

In Column 15, Line 20, delete "$\theta_2$)" and insert -- -$\theta_2$) --, therefor.

In the Claims

In Column 22, Line 4, in Claim 11, delete "frequency," and insert -- frequency --, therefor.

Signed and Sealed this
Fourteenth Day of October, 2014

Michelle K. Lee
*Deputy Director of the United States Patent and Trademark Office*